United States Patent
Shibata et al.

(10) Patent No.: US 8,172,947 B2
(45) Date of Patent: May 8, 2012

(54) SUBSTRATE PROCESSING APPARATUS AND ATTACHING/DETACHING METHOD OF REACTION VESSEL

(75) Inventors: Koji Shibata, Toyama (JP); Masahiro Tatta, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1234 days.

(21) Appl. No.: 11/902,154

(22) Filed: Sep. 19, 2007

(65) Prior Publication Data

US 2008/0083109 A1    Apr. 10, 2008

(30) Foreign Application Priority Data

Sep. 25, 2006   (JP) ................. 2006-258660

(51) Int. Cl.
| | |
|---|---|
| C23C 16/00 | (2006.01) |
| C23C 16/44 | (2006.01) |
| C23C 16/46 | (2006.01) |
| B21D 39/00 | (2006.01) |
| B01J 19/00 | (2006.01) |
| H01L 21/00 | (2006.01) |
| H01L 21/02 | (2006.01) |
| H01L 21/205 | (2006.01) |
| H01L 21/22 | (2006.01) |
| H01L 21/31 | (2006.01) |
| F28D 21/00 | (2006.01) |
| F27D 1/18 | (2006.01) |

(52) U.S. Cl. ........ 118/715; 118/724; 118/725; 118/733; 29/592; 29/418; 29/423; 29/428; 432/1; 432/3; 432/250; 427/248.1

(58) Field of Classification Search ................. 118/715, 118/724, 725, 733; 29/592, 418, 423, 428; 432/1, 3, 250; 427/248.1
See application file for complete search history.

(56) References Cited

U.S. PATENT DOCUMENTS

| 5,622,639 A | 4/1997 | Kitayama et al. |
| 2008/0083109 A1* | 4/2008 | Shibata et al. ........... 29/428 |

FOREIGN PATENT DOCUMENTS

| JP | A 8-120453 | 5/1996 |
| JP | A 11-67679 | 3/1999 |
| KR | 10-0336167 B1 | 9/2002 |

* cited by examiner

*Primary Examiner* — Jeffrie R Lund
(74) *Attorney, Agent, or Firm* — Oliff & Berridge, PLC

(57) ABSTRACT

To provide a substrate processing apparatus, comprising: a reaction vessel having a processing chamber inside that processes a substrate; a heating device that heats said substrate from an outer peripheral side of the reaction vessel; a lid member that closes the processing chamber; an attachment/detachment jig placed on the lid member for attaching/detaching the reaction vessel from an inside of the heating device; and a support section provided in an upper side of a lower end of the reaction vessel on an inside wall of the reaction vessel, and abutted on an upper surface of the attachment/detachment jig for attaching/detaching the reaction vessel from the inside of the heating device.

17 Claims, 21 Drawing Sheets

SUBSTRATE PROCESSING APPARATUS AND ATTACHING/DETACHING METHOD OF REACTION VESSEL

BACKGROUND

1. Technical Field

The present invention relates to a substrate processing apparatus and an attaching/detaching method of a reaction vessel, and for example relates to the substrate processing apparatus used in a semiconductor manufacturing apparatus and an attaching/detaching method of the reaction vessel.

2. Background Art

FIG. 20 shows a sectional view of a batch type vertical processing furnace that simultaneously processes a plurality of wafers used in a conventional substrate processing apparatus.

A vertical processing furnace 302 is provided in a casing not shown. This vertical processing furnace 302 is composed of a heater unit 306 and a reaction vessel 307 inserted into the heater unit 306. The reaction vessel 307 is composed of a reaction tube 303 and a furnace throat flange 309 for supporting the reaction tube 303. The reaction tube 303 is composed of an outer tube 305 and an inner tube 304 provided in the outer tube 305. The furnace throat flange 309 is made of metal (for example, see patent document 1). A boat 317, with a plurality of wafers 200 loaded in a multistage manner, is inserted into the inner tube 304. The furnace throat flange 309 is closed by a seal cap 319 for supporting the boat 317.

The plurality of wafers 200 loaded in the boat 317 are processed in a process of exhausting residual gas, etc, after reaction from an exhaust tube 331, while supplying gas into the reaction tube 303 from the gas supply tube.

In order to assemble such a vertical processing furnace 302, insert/extraction of the reaction tube 303 to the vertical processing furnace 302 must be performed by using a lower space of the vertical processing furnace 302. The insert/extraction of the reaction vessel 307 to the vertical processing furnace 302 is performed by a boat elevator not shown and an attachment/detachment device (for example, see patent document 2). The reaction vessel 307 is attached from an opening part opened to a lower part of the heater unit 306 fixed to a heater base 351. The reaction vessel 307 needs to be inserted into the heater unit 306 up to an upper side from the exhaust tube 331, because the exhaust tube 331 is protruded, in a state that a part of the reaction vessel 307 is protruded from the heater unit 306. In consideration of a gas flow, the exhaust tube 331 is preferably formed in a cylindrical shape having a large diameter.

However, when the diameter of the exhaust tube 331 is large, a part protruding from the heater unit 306 also becomes longer, thus making the vertical processing furnace 302 larger. Note that by decreasing a height of the reaction vessel 307, processing number of wafers also decreases, which is not preferable because production capability is also decreased. Here, a device to process a large number of wafers by increasing the height of the reaction vessel 307 is called a large batch processing apparatus, and a device to process a small number of wafers by decreasing the height of the reaction vessel 307 is called a small batch processing apparatus.

[Patent document 1]

Japanese Patent Application Laid Open No. 08-120453

[Patent document 2]

Japanese Patent Application Laid Open No. 11-67679

When a reaction vessel structure is applied as it is, the height of the device is increased, thus increasing the height of a clean room, even if the large batch processing apparatus is actually installed in the clean room. Therefore, it becomes difficult to install the reaction vessel 307 in the heater unit 306.

In order to assemble the vertical processing furnace 302, as shown in FIG. 21, the attachment/detachment of the reaction vessel 307 must be performed to the vertical processing furnace 302, by using a transfer chamber 324 as a preliminary chamber adjacently provided in a lower part of the vertical processing furnace 302. The attachment/detachment of the reaction vessel 307 to the vertical processing chamber 302 is performed by using a truck, a boat elevator, and an attachment/detachment jig 300 placed on a seal cap 219.

As shown in the figure, when the exhaust tube 331 is formed in the furnace throat flange 309, unless the wafer processing capability is decreased, the height of the reaction vessel body with the outer tube 305 connected to this furnace throat flange 309 is increased. Therefore, from the restriction of the transfer chamber 324, the outer tube 305 and the furnace throat flange 309 must be separately attached/detached.

In addition, as shown in FIG. 22, under a condition of not changing a device height even when the exhaust tube 331 is integrally formed with the outer tube 305, the outer tube 305 (a part of a designation mark D) does not come out from the heater unit 306 when the outer tube 305 and the furnace throat flange 309 are integrally detached by using the attachment/detachment jig 300, and the outer tube 306 and the furnace throat flange 309 can not be simultaneously attached/detached. Therefore, the outer tube 305 and the furnace throat flange 309 are divided in maintenance, and the attachment/detachment of the outer tube 306 and the attachment/detachment of the furnace throat flange must be dividedly performed in twice or more. Accordingly, a structure of the attachment/detachment jig 300 is complicated, thus generating a time-consuming maintenance work.

SUMMARY OF THE INVENTION

An object of the present invention is to provide a substrate processing apparatus capable of performing maintenance of a reaction vessel without changing a device height or without changing a reaction vessel size, and an attaching/detaching method of the reaction vessel.

According to an aspect of the present invention, there is provided a substrate processing apparatus including:

a reaction vessel having inside a processing chamber for processing a substrate;

a heating device that heats the substrate from an outer peripheral side of the reaction vessel;

a lid member that closes the processing chamber;

an attachment/detachment jig placed on the lid member for attaching/detaching the reaction vessel from the inside of the heating device; and a support section provided in an upper side of a lower end of the reaction vessel on an inside wall of the reaction vessel, and abutted on an upper surface of the attachment/detachment jig for attaching/detaching the reaction vessel from the inside of the heating device.

According to the present invention, the maintenance of the reaction vessel can be performed without changing a device height and without changing a reaction vessel size.

DESCRIPTION OF PREFERRED EMBODIMENTS OF THE INVENTION

Figure 2:
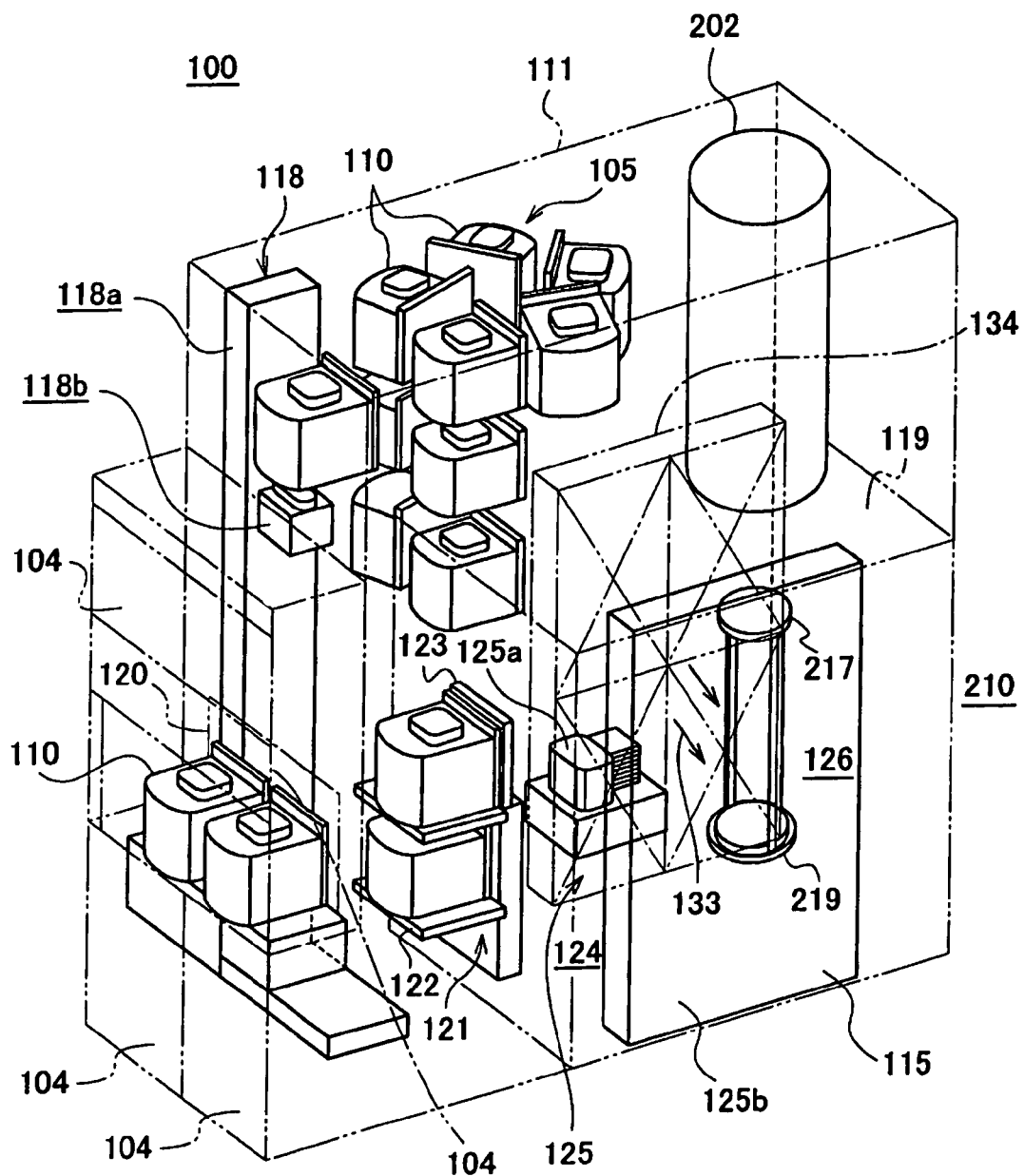
FIG. 2 is an obliquely perspective view of a processing apparatus according to an embodiment of the present invention.

According to a preferred embodiment for executing the present invention, the substrate processing apparatus is constituted as a semiconductor manufacturing apparatus to execute a processing step in a manufacturing method of a semiconductor device (IC), as an example. Note that hereunder, an explanation is given to a case that the substrate processing apparatus of the present invention is applied to a vertical semiconductor manufacturing device (called simply a processing apparatus hereunder) as a semiconductor manufacturing device, for performing oxidation, diffusion processing and a CVD processing. FIG. 2 shows a perspective view of the processing apparatus applied to an embodiment of the present invention. In addition, FIG. 3 is a side perspective view of the processing apparatus shown in FIG. 2.

Figure 3:
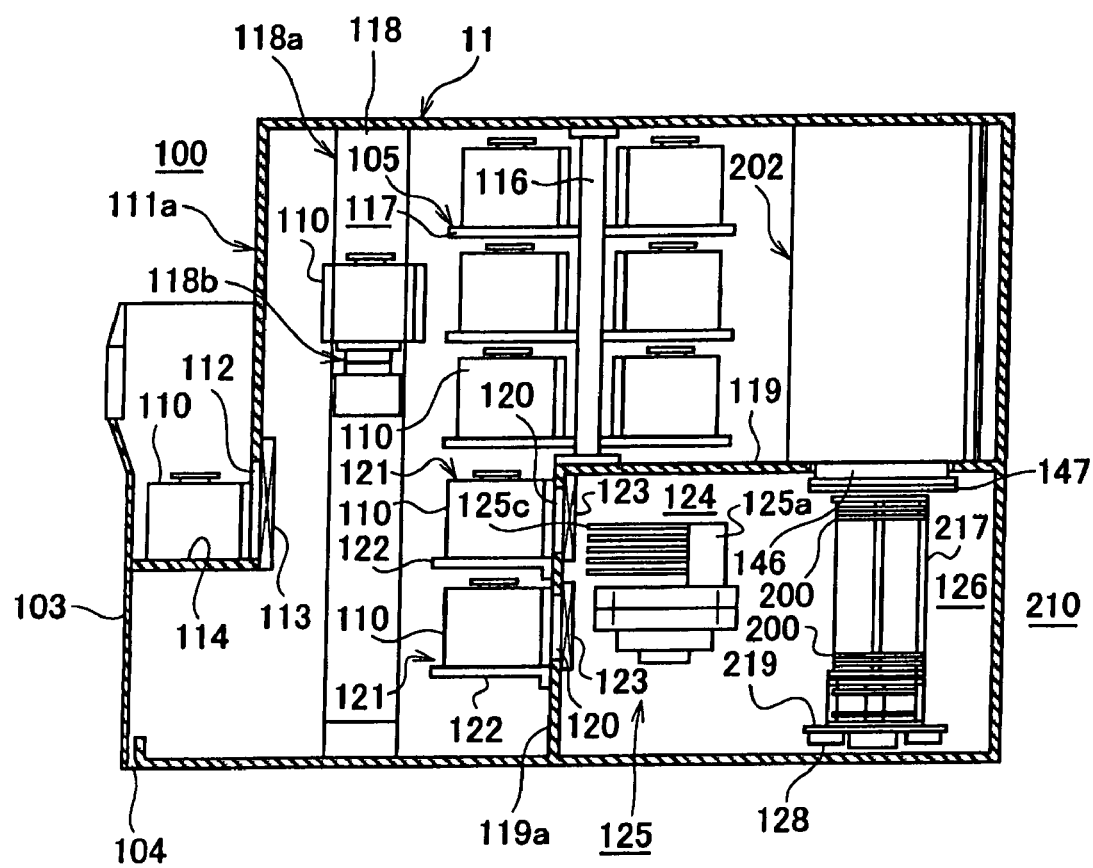
FIG. 3 is a side perspective view of the processing apparatus according to an embodiment of the present invention.

As is shown in FIG. 2 and FIG. 3, a casing 111 is included in a processing apparatus 100 of this embodiment, in which hoops (substrate containers, called pods hereunder) 110 are used as wafer carriers storing wafers (substrates) 200 composed of silicon, etc. A front maintenance opening 103 is opened in front of a front wall 111a of the casing 111 in a maintenance possible manner, and front maintenance doors 104 and 104 for opening and closing this front maintenance opening 103 are respectively built. A pod loading/unloading opening (substrate container loading/unloading opening) 112 is opened in a front wall 111a of the casing 111 so as to communicate with inside/outside the casing 111, so that the pod loading/unloading opening 112 is opened and closed by a front shutter (substrate container loading/unloading outlet opening/closing mechanism) 113.

A loading port (substrate container transfer stage) 114 is installed on the front side of the pod loading/unloading opening 112, so that the loading port 114, with pods 110 placed thereon, performs positioning. The pods 110 are loaded on the loading port 114 by an intra-process carrying device (not shown) and are unloaded from the loading port 114.

A rotary pod shelf (substrate container placement shelf) 105 is set in an upper part at a nearly central part in the front-rear direction in the casing 111, so that the rotary pod shelf 105 stores a plurality of pods 110. Namely, the rotary pod shelf 105 has a support 116 vertically installed upright and intermittently rotated in a horizontal surface, and a plurality of shelf plates (substrate container placement tables) 117 radially supported by the support 116 at each position of upper, middle, and lower stages, and a plurality of shelf plates 117 hold the pods 110 thereon in a state of being placed thereon.

A pod carrying device (substrate container loading device) 118 is installed between the load pod 114 and the rotary pod shelf 105 in the casing 111. The pod carrying device 118 is composed of a pod elevator (substrate container elevating mechanism) 118a capable of elevating the pod 110 in a state of holding the pod 110, and a pod transport mechanism (substrate container transport mechanism) 118b as a transport mechanism, and the pod carrying device 118 transports the pod 110 among the load pod 114, the rotary pod shelf 105, and a pod opener (substrate container lid member opening/closing mechanism) 121, by a continuous operation of the pod elevator 118a and the pod loading mechanism 118b.

A sub-casing 119 is constructed up to a rear end, in a lower part at a nearly central part in the front-rear direction in the casing 111. A pair of wafer loading/unloading openings (substrate loading/unloading openings) 120 for loading/unloading wafers 200 into/from the sub-casing 119 are opened in a front wall 119a of the sub-casing 119, so as to be aligned in upper and lower two stages in a vertical direction, and a pair of pod openers 121, 121 are respectively set in the wafer loading/unloading openings 120, 120 of upper and lower stages.

The pod openers 121 include placement tables 122, 122 for placing the pods 110 thereon, and cap attachment/detachment mechanism (lid member attachment/detachment mechanism) 123, 123 for attaching/detaching the caps (lid members) of the pods 110. The pod openers 121 open/close wafer loading/unloading openings of the pods 110 by attaching/detaching the cap attachment/detachment mechanism 123 of the caps of the pods 110 placed on the placement tables 122.

In the sub-casing 119, a transfer chamber 124 is formed, which is fluidically separated from a setting space of the pod carrying device 118 and the rotary pod shelf 105. A wafer transfer mechanism (substrate transfer mechanism) 125 is set in a front side region of the transfer chamber 124, and a wafer transfer mechanism 125 is constituted of a wafer transfer device (substrate transfer device) 125a whereby wafers 200 can be horizontally rotated and directly moved, and a wafer transfer device elevator (substrate transfer device elevating mechanism) 125b for elevating the wafer transfer device 125a. As is schematically shown in FIG. 2, the wafer transfer device elevator 125b is set between a right side end portion of the casing 111 and a right end portion of a frontward region of the transfer chamber 124 in the sub-casing 119 of withstand pressure. By a continuous operation of the wafer transfer device elevator 125b and the wafer transfer device 125a, charging and discharging of the wafers 200 into a boat (substrate holder) 217 is enabled, with a tweezer (substrate holding member) 125c of the wafer transfer device 125a set as a placement section of the wafers 200.

A stand-by section 126 that stands-by, with the boat 217 housed therein, is formed in a backside region of the transfer chamber 124. A vertical processing furnace 202 is provided in an upper part of the stand-by section 126. A lower end portion of the vertical processing furnace 202 is opened/closed by a furnace port shutter (furnace port opening/closing mechanism) 147.

As is schematically shown in FIG. 2, the boat elevator (substrate holder elevation mechanism) 115 for elevating the boat 217 is set between the right side end portion of the casing 111 and the right end portion of the stand-by section 126 of the sub-casing 119 of withstand pressure. The seal cap 219 as the lid member is horizontally installed in an arm 128 (see FIG. 3) as a connecting fixture connected to an elevation table of the boat elevator 115, wherein the boat 217 is vertically supported by the seal cap 219 so that the lower end portion of the vertical processing furnace 202 can be closed.

The boat 217 includes a plurality of holding members, so that a plurality of (for example, about 50 to 125) wafers 200 are respectively horizontally held in a state of being formed in a line in the vertical direction, with its center aligned with each other.

As is schematically shown in FIG. 2, a clean unit 134 composed of a supply fan and a dust-free filter for supplying cleaned atmosphere or clean air 133, being inert gas, is installed at the wafer transfer device elevator 125b side of the transfer chamber 124 and at the left side end portion of the opposite side to the boat elevator 115 side, and a notch aligning device 135 as a substrate aligning device for aligning the position in a circumferential direction of the wafers, although not shown, is installed between the wafer transfer device 125a and the clean unit 134.

The clean air 133 blown off from the clean unit 134 is flown to the notch aligning device 135, the wafer transfer device 125a, and the boat 217 in the stand-by section 126, and thereafter is sucked by a duct not shown and is exhausted to outside of the casing 111 or is circulated up to a primary side (supply side) being a sucking side of the clean unit 134, and is blown out into the transfer chamber 124 by the clean unit 134 again.

Next, the operation of a processor of this embodiment will be explained.

As is shown in FIG. 2 and FIG. 3, when the pods 110 are supplied to the loading port 114, the pod loading/unloading opening 112 is opened by a front shutter 113, and the pods 110 on the loading port 114 are loaded to the casing 111 from the pod loading/unloading opening 112 by the pod carrying device 118.

The loaded pods 110 are automatically carried and transferred by the pod carrying device 118 to a designated shelf plate 117 of the rotary pod shelf 105, temporarily stored therein, and thereafter are carried to one of the pod openers 121 from the shelf plate 117 and transferred to the placement tables 122 or are directly carried to the pod openers 121 and transferred to the placement tables 122. At this time, the wafer loading/unloading opening 120 of the pod opener 121 is closed by the cap attachment/detachment mechanism 123, and the clean air 133 is flown to the transfer chamber 124 and the transfer chamber 124 is filled with this clean air. For example, when the transfer chamber 124 is filled with nitrogen gas as the clean air 133, oxygen concentration is set at 20 ppm or less and is set further lower than the oxygen concentration of inside (atmospheric atmosphere) in the casing 111.

The opening side end face of the pod 110 placed on the placement table 122 is pressed against an opening edge side of the wafer loading/unloading opening 120 in the front wall 119a, and its cap is detached by the cap attachment/detachment mechanism 123 and its wafer loading/unloading opening is opened.

When the pod 110 is opened by the pod opener 121, the wafer 200 is picked up through the wafer loading/unloading opening by the tweezer 125c of the wafer transfer device 125a from the pod 110, and after the wafer is aligned by the notch aligning device 135, the wafer is loaded to the stand-by section 126 behind the transfer chamber 124 and is charged in the boat 217. The wafer transfer device 125a after transferring the wafer 200 to the boat 217 returns to the pod 110 and charges the next wafer 200 to the boat 217.

During charging work of the wafer to the boat 217 by the wafer transfer mechanism 125 in one (upper stage or lower stage) of the pod openers 121, another pod 110 is transferred and placed by the pod transfer device 118 from the rotary pod shelf 105, and an opening work of the pod 110 by the pod opener 121 is simultaneously progressed.

When previously designated number of wafers 200 is charged in the boat 217, the lower end portion of the vertical processing furnace 202 that has been closed by the furnace port shutter 147 is opened by the furnace port shutter 147. Subsequently, the boat 217 having a group of wafers 200 held therein is loaded into the vertical processing furnace 202, when the seal cap 219 is elevated by the boat elevator 115.

After loading, an arbitrary processing is applied to the wafer 200 in the vertical processing furnace 202. After processing, the wafer 200 and the pod 110 are discharged to the outside of the casing 111 by a procedure opposite to the aforementioned procedure, excluding an alignment step of the wafer by the notch aligning device 135.

Next, details of the aforementioned vertical processing furnace 202 are further explained, and an attachment/detachment device for attaching/detaching a reaction vessel 207 from a heater unit 206 will be explained.

[Processing Furnace]

The aforementioned processing furnace will be explained in detail.

Figure 1:
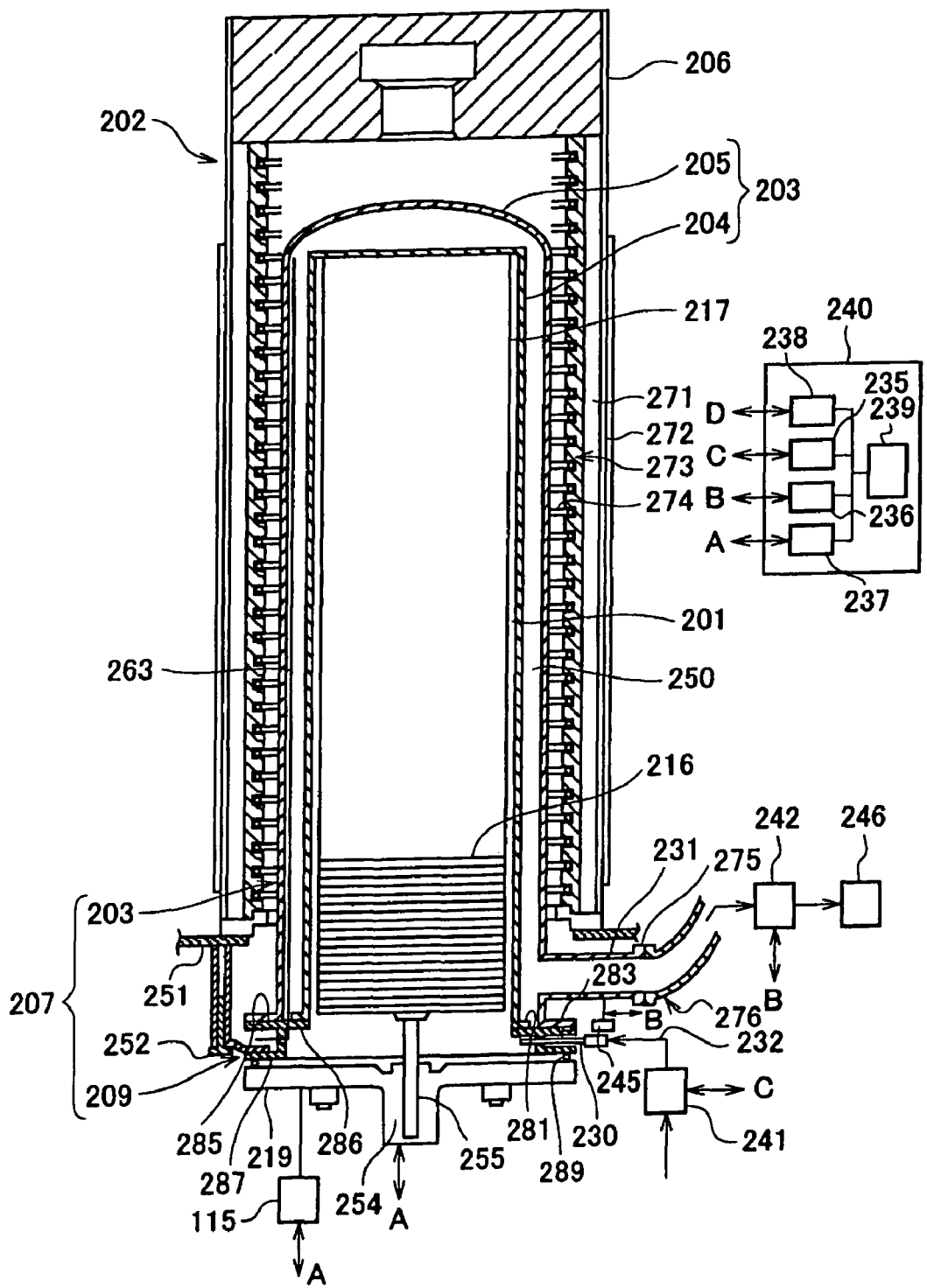
FIG. 1 is an outlined vertical sectional view showing a structure of a processing furnace of a substrate processing apparatus according an embodiment of the present invention.

FIG. 1 is a vertical sectional view showing an outlined block diagram of the vertical processing furnace 202 of the processing apparatus suitably used in the embodiments of the present invention.

As shown in FIG. 1, the vertical processing furnace 202 includes the heater unit 206 having a heater as a heating device. The heater unit 206 has a topped cylindrical shape, and is vertically installed by being supported by a heater base 251 as a holding plate.

The heater unit 206 is mainly composed of a heat insulating member 271 having a topped cylindrical shape, a heater cover 272 of a metal plate covering the heat insulating member 271, a heating wire support column 273 installed upright along an inner surface of the heat insulating member 271, and a heating wire 274 as a heater supported by the heating wire support column 273 and formed in a coil shape.

A reaction tube 203 is disposed concentrically with the heater unit 206 in the inside of the heater unit 206. The reaction tube 203 is composed of an inner tube 204 as an inner reaction tube and an outer tube 205 as an external reaction tube.

The inner tube 204 is placed on an upper surface of an upper end inner flange 286, when the wafer 200 is processed in the inner tube 204. This inner tube 204 is made of a non-metal material of corrosion resistance, namely, a heat resistance material such as quartz ($SiO_2$) or silicon carbide (SiC). The inner tube 204 is formed in a cylinder shape having a flange 281 on the lower end, with upper end and lower end opened. A processing chamber 201 is formed in a cylinder hollow part of the inner tube 204, so that the wafer 200 as a substrate can be contained in a state of being aligned vertically in multiple stages in a horizontal posture by the boat 217 as will be described later.

The outer tube 205 is made of non-metal material having heat resistance and corrosion resistance properties, and is made of, for example, the heat resistance material such as quartz or silicon carbide, and is formed in a cylinder shape having a flange 283 in the lower end, with inner diameter set larger than an outer diameter of the inner tube 204, the upper end closed, and the lower end opened, and is provided concentrically with the inner tube 204.

An inlet manifold 209 as a holding fixture for holding the lower end of the reaction tube 203 is disposed in a lower part of the outer tube 205 so as to be concentrically connected to the outer tube 205. The inlet manifold 209 is made of a material having heat resistance and corrosion resistance properties and is made of stainless, and is formed in a cylinder shape, with upper end and lower end opened, having an outer flange 285 and an inner flange 286 at the upper end, and having a flange 287 at the lower end. The inlet manifold 209 is provided, so that the inner flange is engaged with the flange 281 of the inner tube 204, the outer flange 285 is engaged with the flange 283 of the outer tube 205, to support the inner tube 204 and the outer tube 205 respectively.

In addition, an O-ring not shown as a seal member is provided between the inlet manifold 209 and the outer tube 205. The inlet manifold 209 is supported by the heater base 251. By supporting the inlet manifold 209 by the heater base 251, the reaction tube 203 is vertically installed.

A single or a plurality of gas supply tubes 230 as gas introduction parts are connected to the inlet manifold 209 so as to communicate with the inside of the processing chamber 201. A processing gas supply source and an inert gas supply source not shown are connected to the upstream side, being the opposite side to a connection side of the gas supply tube 230, via an MFC (mass flow controller) 241 as a gas flow rate controller. A gas flow rate controller 235 is electrically connected to the MFC 241, so that a flow rate of supplied gas is controlled to be a desired amount at a desired timing.

A seal cap 219 as a lid member capable of air-tightly closing a lower end opening of the inlet manifold 209 is provided in the lower part of the inlet manifold 209. The seal cap 219 abuts on the lower end of the inlet manifold 209 from the vertically lower side. The seal cap 219 is, for example, made of metal such as stainless, and is formed in a disc shape. An O-ring 289 as a seal member that abuts on the upper end of the inlet manifold 209 is provided on the upper surface of the seal cap 219. A rotation mechanism 254 for rotating the boat 217 is set at the opposite side to the processing chamber 201 of the seal cap 219. A rotation shaft 255 of the rotation mechanism 254 penetrates the seal cap 219 and is connected to the boat 217 as will be described later, so that the wafer 200 is rotated by rotating the boat 217. The seal cap 219 is vertically elevated by the boat elevator 115 as an elevation mechanism vertically installed at the outside of the reaction tube 203, so that the boat 217 can be loaded/unloaded to the processing chamber 201. A drive controller 237 is electrically connected to the rotation mechanism 254 and the boat elevator 115, so as to control a drive to perform desired operation at a desired timing.

An exhaust tube 231 for exhausting the inside of the reaction vessel 207 is integrally formed with a side wall of the reaction vessel 207 located between the heater unit 206 and the seal cap 219, for example, a side wall of the outer tube 205. In this embodiment, a plurality of exhaust tubes 231 are formed in a vertical straight-tube shape, and are provided integrally with the lower part of the outer tube 205 exposed to the outside from the lower end of the heater unit 206. The exhaust tube 231 is directed toward a maintenance area 210 facing one side face of the casing 111 (see FIG. 4).

The reaction vessel 207 is formed by the aforementioned reaction tube 203 and the inlet manifold 209.

As shown in FIG. 1, a pressure sensor 245 as a pressure detector and a vacuum exhaust device 246 such as a vacuum pump via a pressure adjustment device 242 are connected to the downstream side of the exhaust tube 231, so that the inside of the processing chamber 201 can be evacuated to be set in a prescribed pressure (vacuum state). The pressure adjustment device 242 and the pressure sensor 245 have a pressure controller 236 electrically connected thereto, and the pressure controller 236 controls the pressure so that the pressure in the processing chamber 201 is set at a desired pressure by the pressure adjustment device 242 based on the pressure detected by the pressure sensor 245.

The boat 217 as a substrate holding fixture is made of the heat resistance material such as quartz or silicon carbide, so that a plurality of wafers 200 are aligned and held in multiple stages in a horizontal posture, with centers mutually aligned. In addition, a plurality of disc-shaped heat insulating plates 216 as heat insulating members made of the heat insulating material such as quartz or silicon carbide are disposed in the lower part of the boat 217, so that heat from the heater unit 206 is hardly transmitted to the inlet manifold 209.

A temperature sensor 263 as a temperature detector is installed in the reaction tube 203. A temperature controller 238 is electrically connected to a heating line 274 and a temperature sensor 263 of the heater unit 206 in particular, so that a temperature in the processing chamber 201 shows a desired temperature distribution by adjusting a power supply condition to the heater unit 206 based on temperature information detected by the temperature sensor 263.

The gas flow rate controller 235, pressure controller 236, drive controller 237, temperature controller 238 constitute an operation section and an input/output section, and are electrically connected to a main controller 239 that controls an entire body of the substrate processing apparatus. Such gas flow rate controller 235, pressure controller 236, drive controller 237, temperature controller 238, and main controller 239 are constituted as a controller 240.

Next, by using the vertical processing furnace 202 having the above-described constitution, explanation will be given to a method of forming a thin film on the wafer 200 by a CVD method, as one step of a manufacturing step of the semiconductor device. Note that in the explanation given hereunder, the operation of each part constituting the processing apparatus as the substrate processing apparatus is controlled by the controller 240.

When the plurality of wafers 200 are charged in the boat 217, as shown in FIG. 1, the boat 217 holding the plurality of wafers 200 is lifted by the boat elevator 115 and is loaded in the processing chamber 201. In this state, the seal cap 219 is set in a state of sealing the lower end of the inlet manifold 209 via the O-ring 289.

The inside of the processing chamber 201 is evacuated by the vacuum exhaust device 246 so as to be set in a desired pressure (vacuum state). At this time, the pressure in the processing chamber 201 is measured by the pressure sensor 245 and based on this measured pressure, the pressure adjustment device 242 is feedback-controlled. In addition, the heater unit 206 heats the inside of the processing chamber 201 so as to be set at a desired temperature. At this time, the power supply condition to the heater unit 206 is feedback-controlled based on the temperature information detected by the temperature sensor 263 so that the inside of the processing chamber 201 shows a desired temperature distribution. Subsequently, the wafer 200 is rotated when the boat 217 is rotated by the rotation mechanism 254.

Subsequently, the gas supplied from the processing gas supply source and controlled to be a desired flow rate by the MFC 241 is introduced into the processing chamber 201 from the gas supply tube 230. The introduced gas drifts upward in the processing chamber 201, flows out to a columnar space 250 from an upper end opening of the inner tube 204 and is exhausted from the exhaust tube 231. The gas is brought into contact with the surface of the wafer 200 during passing through the processing chamber 201, thereby depositing the thin film on the surface of the wafer 200 by thermal CVD reaction at this time.

When a previously set processing time is elapsed, the inert gas is supplied from the inert gas supply source via the gas supply tube 230, to substitute the inside of the processing chamber 201 with the inert gas and return the pressure in the processing chamber 201 to a normal pressure.

Thereafter, the seal cap 219 is descended by the boat elevator 115, to open the lower end of the inlet manifold 209, and an already processed wafer 200 is unloaded to the outside of the reaction tube 203 from the lower end of the inlet manifold 209 in a state of holding the boat 217. Thereafter, the already processed wafer 200 is discharged from the boat 217.

[Attachment/Detachment Device]

Incidentally, it is necessary to use the transfer chamber 124 as a preliminary chamber adjacently provided in the lower part of the vertical processing furnace 202, and perform insert/extraction of the reaction vessel 207 into/from the vertical processing furnace 202. The attachment/detachment of the reaction vessel 207 into/from the vertical processing furnace 202 is performed by using the carriage, the boat elevator 115, and an attachment/detachment jig placed on the seal cap 219.

First, a circumference of the maintenance area 210 of the casing 111 is explained and next the attachment/detachment of the reaction vessel is schematically explained. Thereafter, the attachment/detachment jig is explained in detail.

Figure 4:
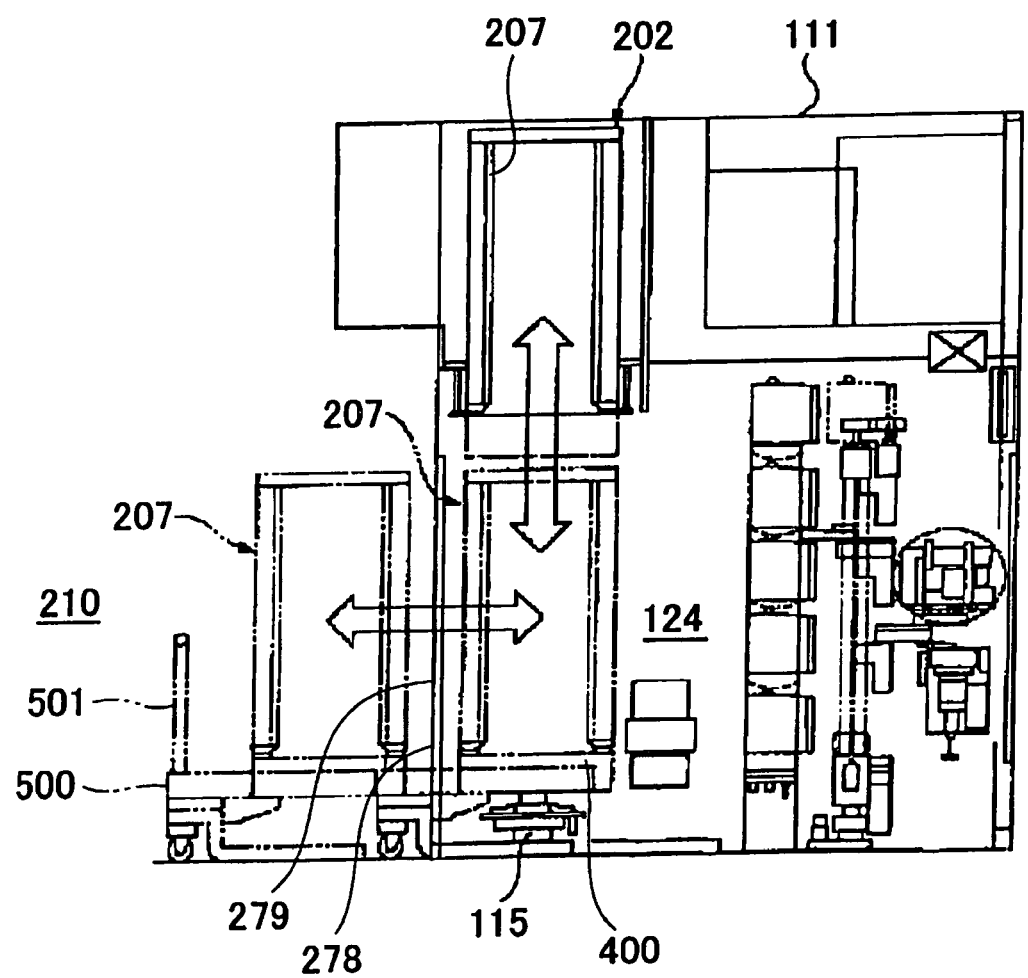
FIG. 4 is a perspective view viewed from another side of the processing apparatus according to an embodiment of the present invention.

As shown in FIG. 4, particularly a replacement work of the reaction vessel 207 out of the vertical processing furnace 202 is required at a proper interval. When the replacement work of the vertical processing furnace 202 is performed, replacement of the reaction vessel 207 is performed through the transfer chamber 124 of a backside lower part of the device, by elevating the reaction vessel 207 using the boat elevator 115. Thus, the replacement work of the reaction vessel 207 can be performed by using a carriage 500. Note that the replacement work of the reaction vessel 207 includes not only a work of newly replacing the reaction vessel 207 itself but also a work of wet-cleaning a reaction product adhered to the reaction vessel 207 at the outside of the vertical processing furnace 202 and re-attaching the reaction vessel from which the reaction product is removed.

The processing apparatus has a transfer chamber 124 as a preliminary chamber serially connected to the lower side of the vertical processing furnace 202, and a maintenance opening part 278 opened in the one side surface of the transfer chamber 124. The maintenance opening part 278 has a door 279, and by opening the door 279, communication with a maintenance area 210 adjacent to the one side surface of the transfer chamber 124 is enabled. In addition, by this maintenance opening part 278, the inner flange 286 and the attachment/detachment jig 400 can be horizontally moved between the transfer chamber 124 and the maintenance area 210, with the reaction vessel 207 as a support section at the lower end of the reaction vessel, in a state that the reaction vessel 207 is supported by the attachment/detachment jig 400.

[Schematic Explanation of Attachment/Detachment of the Reaction Vessel]

An outlined explanation will be given to the attaching/detaching method (mainly an attachment method) of the reaction vessel 207 to the vertical processing furnace 202 using the aforementioned boat elevator 115, carriage 500, and attachment/detachment jig 400.

Figure 5:
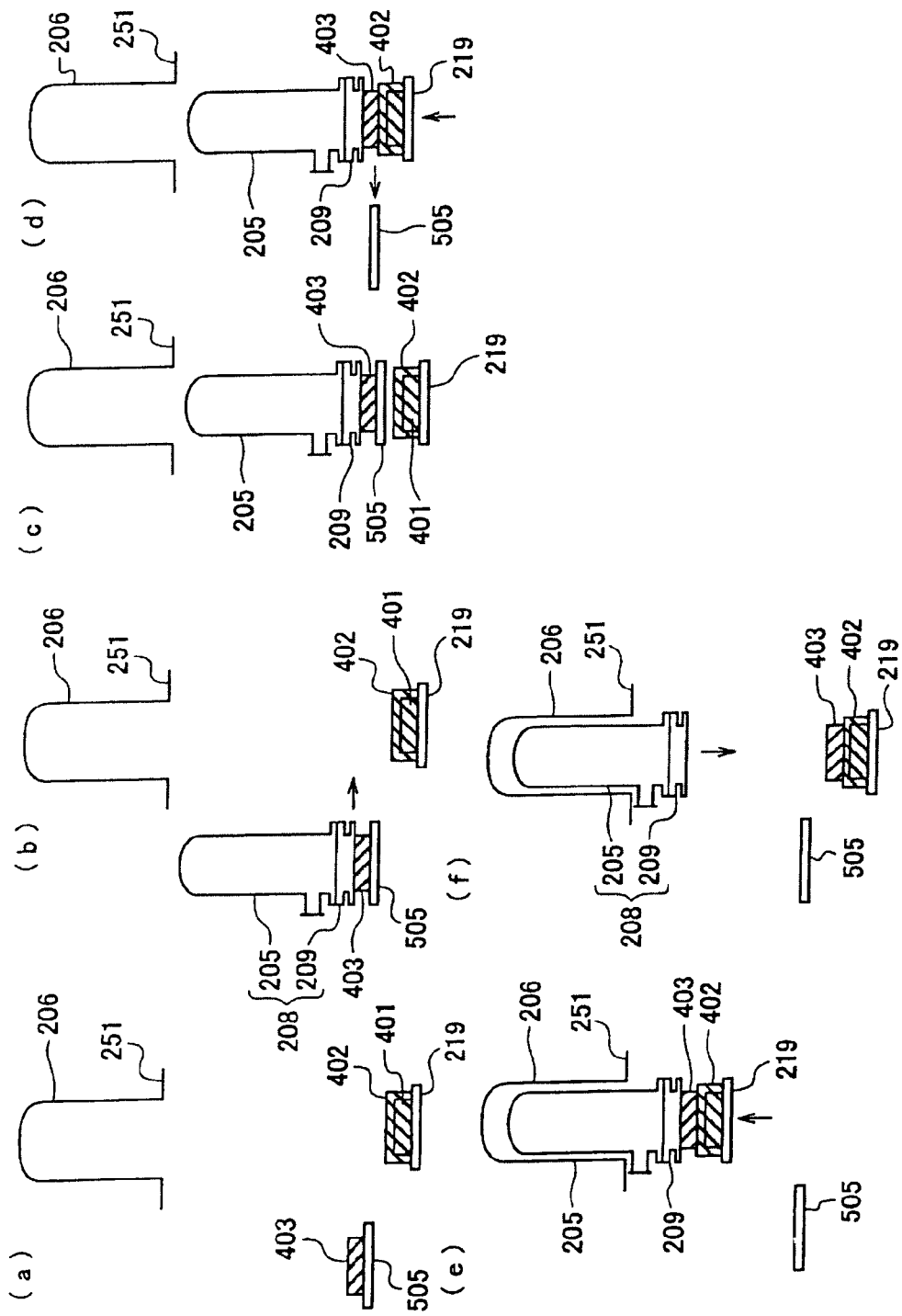
FIG. 5 is an outlined explanatory view showing a assembly procedure of a reaction vessel body according to an embodiment of the present invention.
Figure 6:
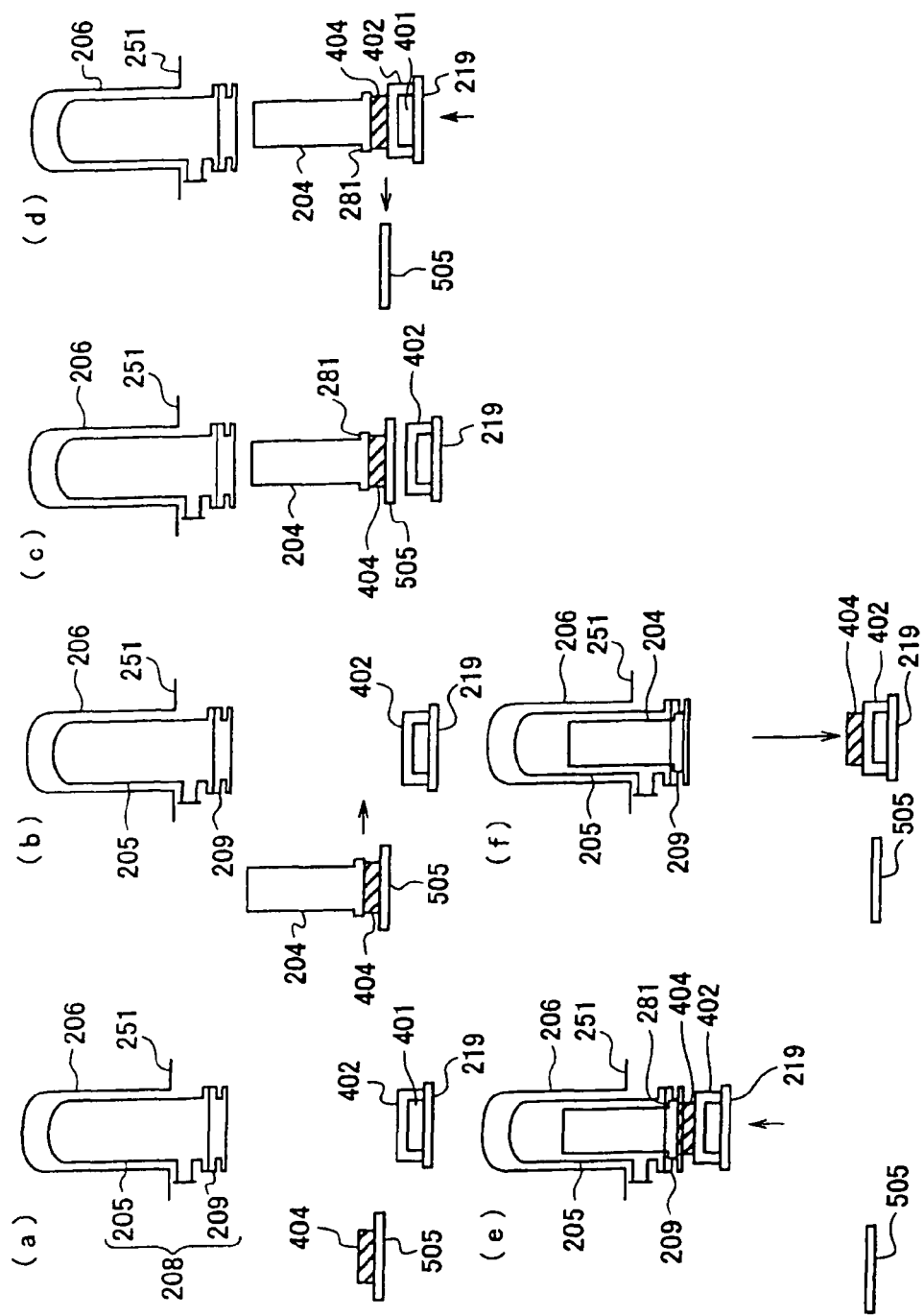
FIG. 6 is an outlined explanatory view showing the assembly procedure of an inner tube according to an embodiment of the present invention.

FIG. 5 is an outlined explanatory view showing an assembling procedure of a reaction vessel body 208, to which the outer tube 205 and the inlet manifold 209 are joined, out of the reaction vessel 207, and FIG. 6 is an outlined explanatory view showing an assembling procedure of the inner tube 204.

First, the assembling procedure of the reaction vessel body 208 will be explained by using FIG. 5. Here, the attachment/detachment jig 400 is composed of an adaptor 401 for a common jig placed on the seal cap 219 and a common jig 402, and an outer jig 403 transferred to the seal cap 219 from a slide arm 505 provided on the carriage 500.

(a) The door 279 of the maintenance opening part 278 at the maintenance area 210 side facing one side surface of the casing 111 is opened. The boat elevator 115 is descended to a lowermost position (see FIG. 4). The adaptor 401 for the common jig as an attachment/detachment jig is fixed onto the seal cap 219 placed on the boat elevator 115, and the common jig 402 is engaged with this adaptor 401 for the common jig. The outer jig 403 as the attachment/detachment jig is placed on the slide arm 505 at a position where the slide arm 505 of the carriage 500 (see FIG. 4) is retreated to the maintenance area 210.

(b) Further, the reaction vessel body 208, to which the outer tube 205 and the inlet manifold 209 are joined, is installed upright on the outer jig 403. The slide arm 505, on which the reaction vessel body 208 is installed upright via the outer jig 403, is advanced to the lower part of the heater unit 206, through the maintenance opening part 278, by holding a handle 50a of the carriage 500, and the center of the reaction vessel body 208 is aligned with an axial center of the heater unit 206.

(c) The common jig 402 engaged with the adaptor 401 for the common jig via the seal cap 219 is elevated by the boat elevator 115, to receive the outer jig 403 on the common jig 402.

(d) The slide arm 505 is retreated at a position where the outer jig 403 is elevated until the outer jig 403 is detached from the slide arm 505.
(e) Further, the common jig 402 is elevated, and the outer tube 205 is inserted into the heater unit 206. The inlet manifold 209 is fixed to the heater base 251, and the reaction vessel body 208 is attached to the heater unit 206.
(f) The seal cap 219 is descended to the lowermost position, and the outer jig 403, on which the common jig 402 is received, is detached. Thus, an assembly of the reaction vessel body 208 in the heater unit 206 is finished.

Detachment of the reaction vessel body 208 is performed by an opposite procedure to the aforementioned attachment.

Next, assembly of the inner tube 17 will be explained based on FIG. 6. Here, the attachment/detachment jig 400 is composed of the adaptor 401 for the common jig and the common jig 402 placed on the seal cap 219 and the inner jig 404 transferred from the slide arm 505 provided on the carriage 500 to the seal cap 219.

(a) The inner jig 404 as the attachment/detachment jig is placed on the slide arm 505.
(b) The inner tube 204 is installed upright on the slide arm 505 via the inner jig 404.
(c) The slide arm 505, on which the inner tube 204 is installed upright via the inner jig 404, is advanced, then, the slide arm 505 is advanced to the lower part of the heater unit 206, and the center of the inner tube 204 is aligned with the axial center of the heater unit 206. At this time, upper and lower positions are made to be coincident so that a notch part (as will be described later) provided in the inner flange of the inlet manifold 209 and a positioning piece (as will be described later) provided in the flange 281 of the inner tube 204 are overlapped with each other.
(d) The common jig 402 engaged with the adaptor 401 for the common jig via the seal cap 219 is elevated by the boat elevator 115, to receive the inner jig 404 on the common jig 402. The slide arm 505 is retreated at a position where the inner jig 404 is detached from the slide arm 505.
(e) Further, the common jig 402 is elevated, and the inner tube 204 is inserted into the reaction vessel body 208, so that the flange 281 provided at the lower end of the inner tube 204 is brought to a position higher than the inner flange 286 (see FIG. 1) of the inlet manifold 209. By rotating the inner tube 204, the positioning piece is placed at a position of detaching from the notch part. When the seal cap 219 is descended, the inner tube 204 is placed on the inner flange 286. Thus, the reaction vessel body 208 is attached to the vertical processing furnace 202.
(f) The seal cap 219 is descended to the lowermost position, and the inner jig 404 received on the common jig 402 is detached. Thus, the attachment of the reaction vessel body 208 to the heater unit 206 is finished.

The detachment of the inner tube 204 is performed by a procedure opposite to the aforementioned attachment.

Thus, the reaction vessel body (the outer tube 205+the inlet manifold 209) 208, and the inner tube 204 can be individually attached and detached. During attachment/detachment work, the reaction vessel body 208 and the inner tube 204 are supported by the carriage 500 and the boat elevator 115, and therefore a worker has only to perform attachment/detachment of a bolt to/from the heater base 251, thus extremely simplifying the work and eliminating an assembly/disassembly work of the reaction vessel 207 and the inner tube 204. Therefore, an attachment/detachment work procedure is simplified, with no necessity of supporting a heavy weight, thus improving safety and enabling single person's work, and power saving is realized.

[Detailed Explanation of Attachment/Detachment of the Reaction Vessel]

First, after the attachment/detachment jig is explained, the attaching/detaching method will be explained. The attachment/detachment jig 400 is received on the carriage 500 and the boat elevator 115. The outer jig 403 or the inner jig 404 is placed on the slide arm 505 of the carriage 500 as an attachment/detachment jig A. The common jig 402 is placed on the seal cap 219 of the boat elevator 115 as an attachment/detachment jig B.

The outline of the inlet manifold 209 has already been explained. However, here, from the viewpoint of the reaction vessel 207, the inlet manifold 209 will be further explained.

Figure 7:
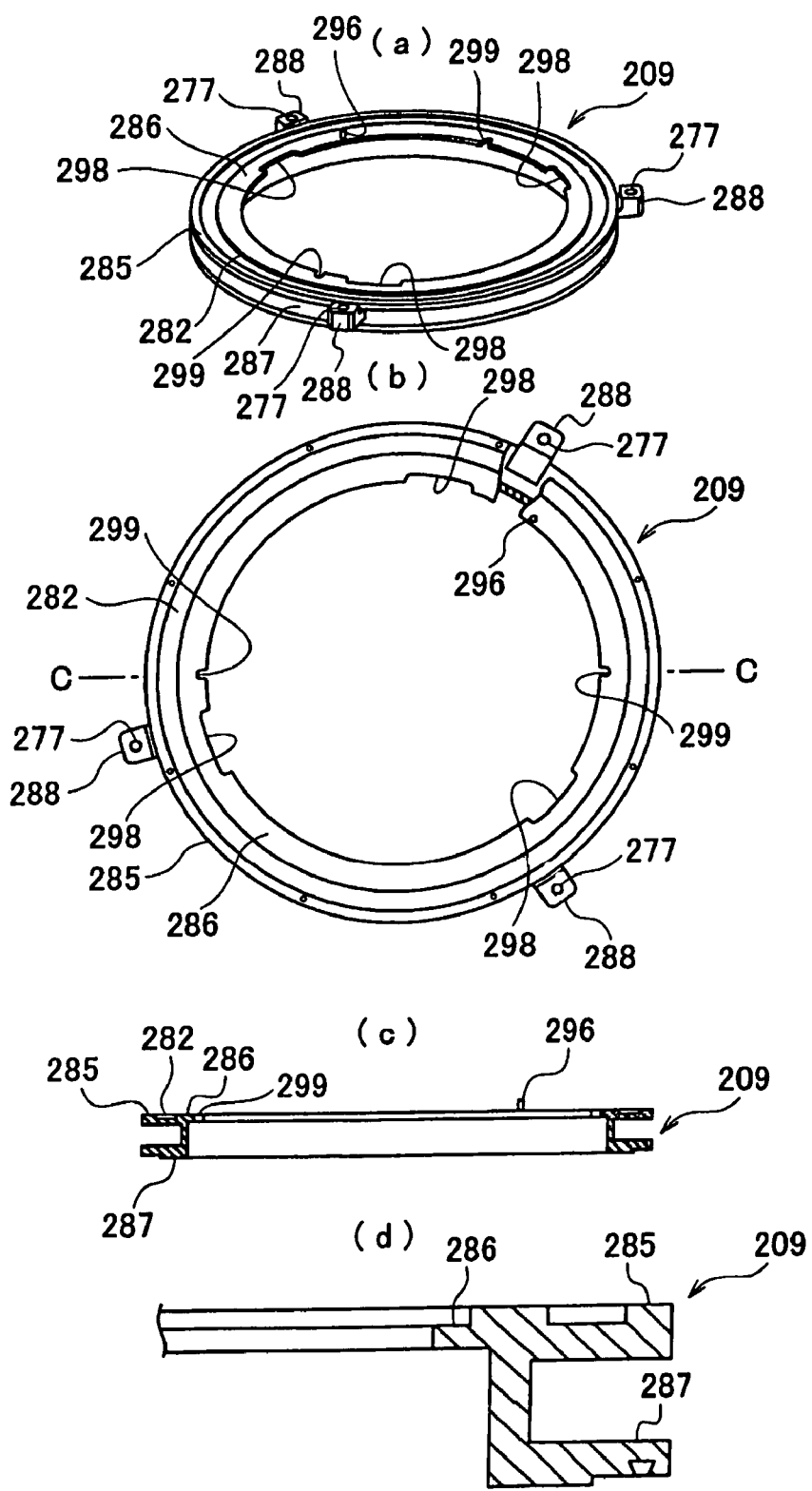
FIG. 7 is an explanatory view of an inlet manifold according to an embodiment of the present invention.

FIG. 7 is an explanatory view of details of the inlet manifold 209, FIG. 7A is a perspective view, FIG. 7B is a plan view, FIG. 7C is a sectional view taken along the line c-c, and FIG. 7D is an expanded sectional view of an essential part of FIG. 7C.

As shown in FIG. 7, the inlet manifold 209 according to an embodiment has a flat columnar shape. The outer flange 285 at the upper end extending outward and the inner flange 286 extending inward are integrally formed with the upper end of the inlet manifold 209. According to the embodiment, the inner flange 286 is sometimes an upper end inner flange provided at a position approximately having a height in one plane with the outer flange 285 of the upper end, and also is sometimes a middle stage inner flange provided at a position having a height lower than the upper end inner flange. In addition, the outer flange 287 of the lower end extending outward is integrally formed with the lower end of the inlet manifold 209.

The inner flange 286 is provided on the side of an upper part from the lower end of the inlet manifold 209, on the inside wall of the inlet manifold 209, and is abutted on the upper surface of the outer jig 403 when the inlet manifold 209 is attached/detached to/from the heater unit 206.

The inner flange 286 is added with a weight of the reaction vessel body 208, when abutted on the outer jig 403 when the reaction vessel body 208 is attached/detached to/from the heater unit 206. Accordingly, the inner flange 286 is constituted to have a strength capable of withstand a load of the reaction vessel body 208.

An attachment hold (not shown) for attaching a plurality of gas supply tubes 230 to a columnar part between the outer flanges 285 and 287 of the upper and lower ends is provided in the inlet manifold 209.

Attachment pieces 288 for fixation projected outwardly in a radial direction are provided in the inlet manifold 209 at equal intervals. A bolt insertion hole 277 is formed in each attachment piece for fixation, the bolt inserted into the bolt insertion hole 277 is screwed into the heater base 251, so that the inlet manifold 209 can be fixed to the heater base 251.

One end of the attachment piece is fixed to the inside of the lower end outer flange 287, and is projected obliquely upward from the upper and lower ends outer flanges 285 and 287, and the other end thereof is extended to have a height in one plane with the upper end outer flange 285. The aforementioned bolt insertion hole 277 is provided in its extension part.

The outer tube 205 is placed on the upper end outer flange 285 of the inlet manifold 209. The inner tube 204 is placed on the upper end inner flange 286. A recessed groove 282 for storing the O-ring for sealing a space between the outer tube 205 and the inlet manifold 209 is provided on the surface of the upper end outer flange 285.

Notch parts 298 for inserting the positioning piece of the inner tube 204 notched outwardly in the radial direction are provided in a circumferential direction at equal intervals.

Also, notched parts 299 for inserting positioning pins of the inner jig 404 are provided in the circumferential direction at equal intervals. In addition, a pin 296 for preventing inner tube slip-off arranged so as to be inside of the inner tube 204 is installed upright in the inner flange 286.

Figure 8:
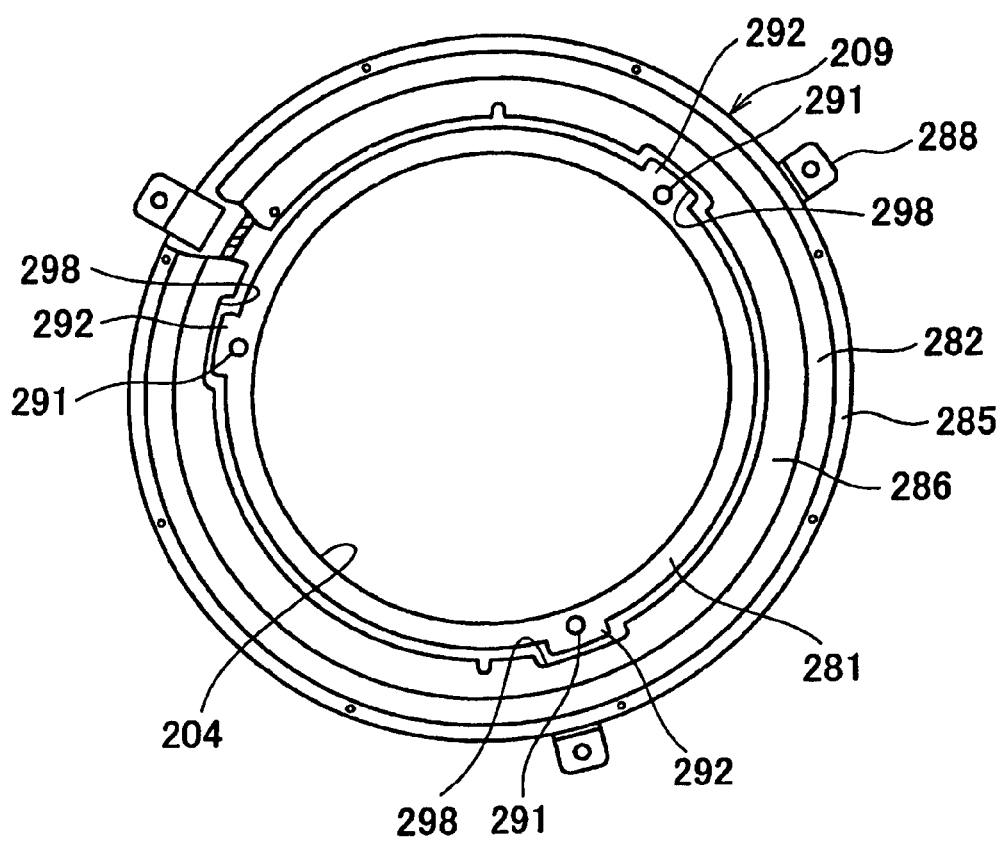
FIG. 8 is a plan view showing a relation between the inlet manifold and a flange of the inner tube according to an embodiment of the present invention.

As shown in FIG. 8, the positioning pieces 292 are projected in at least three places outwardly in the radial direction at a position obtained by equally dividing into three parts a circumference of an outer periphery of the flange 281 of the inner tube 204 inserted into the inlet manifold 209. An outer diameter of the flange 281 is smaller than an inner diameter of the inner flange 286, and the inner diameter of the positioning piece 292 is equal to the outer diameter of the flange 281. Pin holes 291 that can be engaged with set pins 511 as will be described later are bored in the flange 281.

As described above, the notch parts 298 capable of passing through the positioning pieces 292 are provided in at least three places, so that the flange 281 of the inner tube 204 can pass through the inner flange 286, with the positioning pieces 292 being coincident with the notch parts 298.

The assembly of the inner tube 204 is performed after the assembly of the outer tube 205. The inner tube 204 is placed in the flange 281 of the inner tube 204, the positioning pieces 292 are aligned with the notch parts 298, the inner tube 204 is inserted from the lower part of the outer tube 205, and the flange 281 of the inner tube 204 is rotated, with the positioning pieces 292 passed through the notch parts 298, and by deviating positions of the positioning pieces 292 and the notch parts 298, the flange 281 of the inner tube 204 is placed on the inner flange 286. The flange 281 of the inner tube 204 is placed on the inner flange 286 through the positioning pieces 292, and the inner tube 204 is installed upright in the inner flange 286 through the flange 281 of the inner tube 204.

Figure 9:
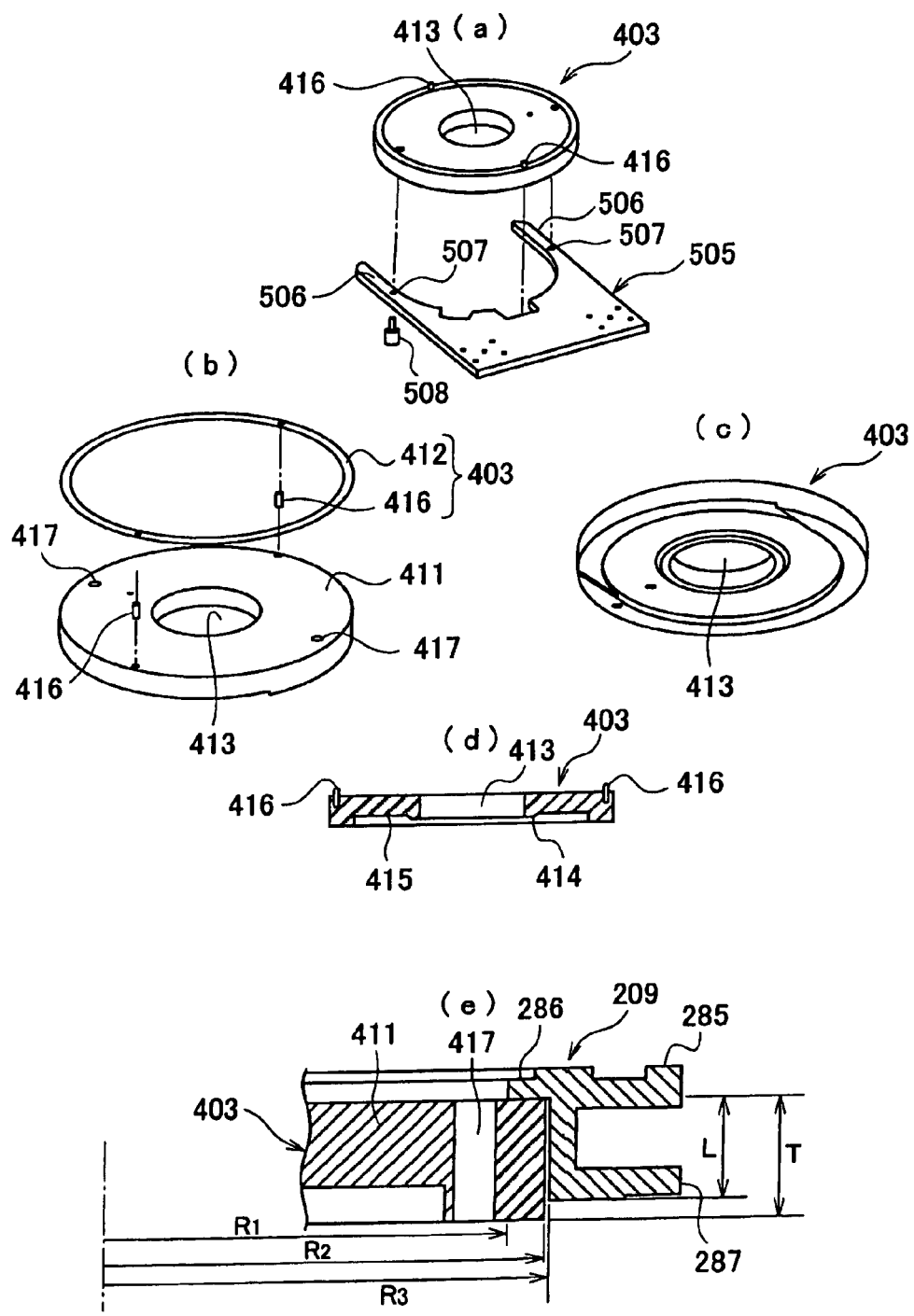
FIG. 9 is an explanatory view of an outer jig according to an embodiment of the present invention.

FIG. 9 is an explanatory view of the outer jig 403 according to an embodiment, FIG. 9A is a perspective view showing a relation between the slide arm 505 and the outer jig 403, FIG. 9B is a decomposed perspective view of the outer jig 403, FIG. 9C is a perspective view viewed from a backside, FIG. 9C is a sectional view, and FIG. 9E is an expanded sectional view when the outer jig 403 is engaged. The outer jig 403 is an attachment/detachment jig for transferring the reaction vessel body 208 to the seal cap 219 from the slide arm 505, in a state of an upright posture. This outer jig 403 is composed of a disc-shaped outer attachment 411 placed on two claws 506 constituting the slide arm 505, and a buffer part 412 that serves as a buffer for a contact with the inner flange 286 on the upper surface of the outer attachment 411. This buffer part 412 is sometimes constituted of a ring-shaped cushion provided on an outer periphery of the upper surface of the outer attachment 411.

Pin holes 507 are provided in two claws 506 constituting the aforementioned slide arm 505, and a set pin 508 is set in each pin hole 507.

A through hole 413 is provided in a center of the outer attachment 411. A tapered projection 414 that engages with a tapered recess 441 formed on the top of the common jig 402 is formed on an outer periphery of the through hole 413 on the lower side of the outer attachment 411.

In addition, a groove portion 415 is provided on a lower surface of the outer attachment 411. One side surface of this groove portion 415 is opened so that the common jig 402 can be attached/detached from one direction side of the side surface of the outer attachment 411.

A positioning pin 416 for engagement with the buffer part 412 is provided on the outer periphery of the upper surface of the outer attachment 411 as a disc part formed in the attachment/detachment jig. Further, this positioning pin 416 is protruded from the upper surface of the outer jig 403, and is engaged with a notch part 299 for inserting the positioning pin of the inlet manifold 209. In addition, a through hole 417 for aligning with the slide arm 505 is provided in the outer attachment 411. A set pin 508 of the slide arm 505 is engaged with this through hole 417.

Particularly as shown in FIG. 9E, the outer jig 403 as the attachment/detachment jig is formed, so that a vertical thickness T of a part abutted on the inner flange 286 at least as a support part is set larger than a vertical length L between the lower end of the inlet manifold 209 and the lower end of the inner flange 286 as the reaction vessel 207.

In addition, the outer jig 403 as the disc part of the attachment/detachment jig is formed, so that its outer diameter R2 is smaller than an inner diameter R3 at the lower side of the inner flange 286 of the inlet manifold 209, and is larger than an inner diameter R1 drawn by the tip end of the inner flange 286.

Thus, the outer flange 287, being the lower end of the inlet manifold 209 as a part of the reaction vessel 207 is prevented from being added with a weight of the outer tube 205 and the inlet manifold 207 as the reaction vessel body 208, when the reaction vessel body 208 is attached/detached from the heater unit 206.

Namely, the lower end of the inlet manifold 209 as the holding fixture is in a state of being non-contact with the outer jig 403, when the outer tube 205 is attached/detached from the heater unit 206.

The outer attachment 411 as a disc part is preferably made of metal. However, more preferably, it may be formed of an aluminum alloy with light weight and excellent workability. The buffer part 412 is preferably formed of cushion such as a resin material, however more preferably it may be formed of a fluorine system resin material having excellent abrasion resistance.

Figure 10:
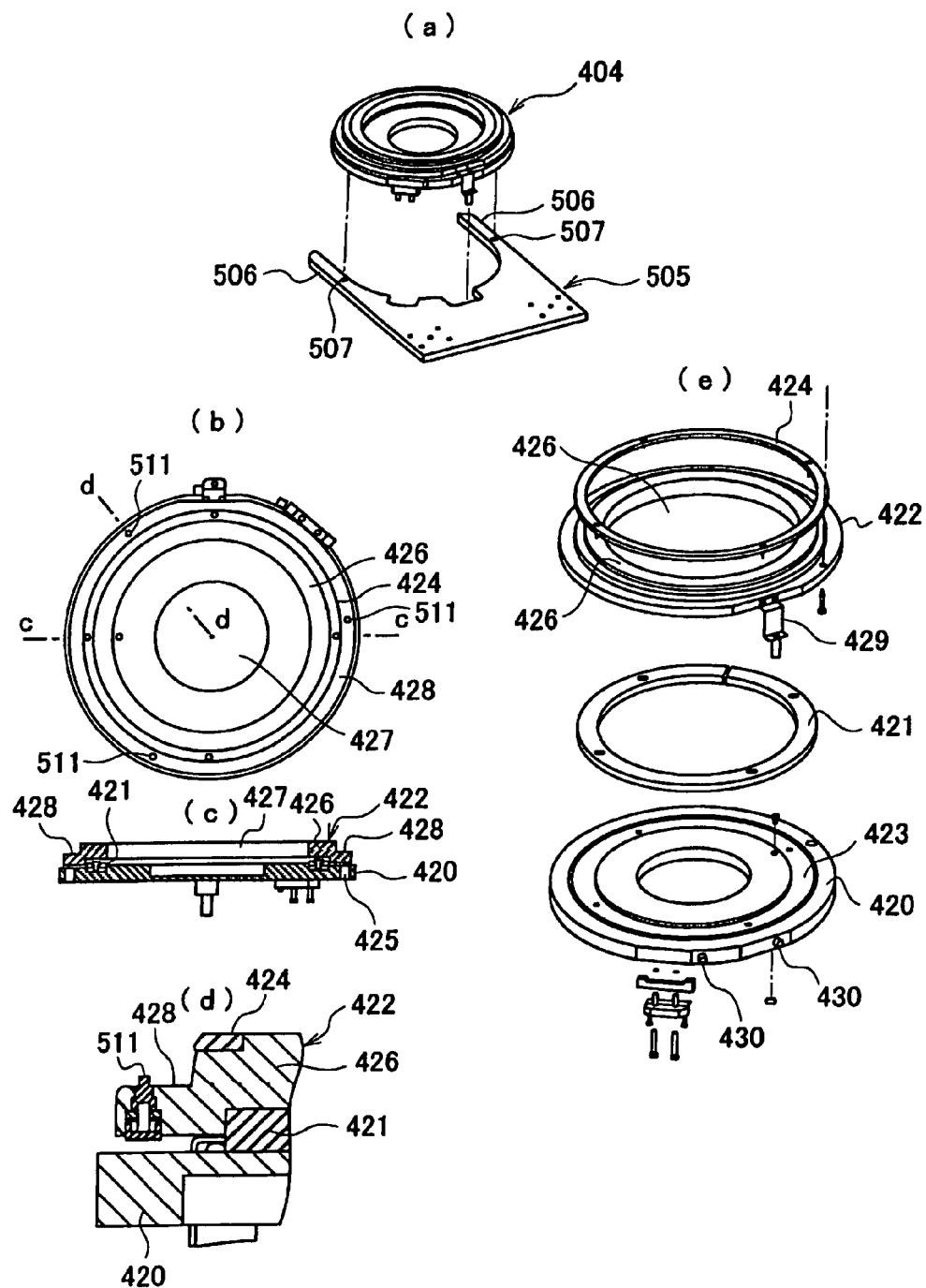
FIG. 10 is an explanatory view of an inner jig according to an embodiment of the present invention.

FIG. 10 is an explanatory view of the inner jig 404 according to an embodiment, FIG. 10A is a perspective view showing a relation between the slide arm 505 and the inner jig 404, FIG. 10B is a plan view of the inner jig 404, FIG. 10C is a sectional view taken along the line c-c, FIG. 10D is a sectional view taken along the line d-d, and FIG. 10E is a decomposed perspective view of the inner jig 404.

The inner jig 404 is the attachment/detachment jig that transfers the inner tube 204 from the slide arm 505 to the seal cap 219 in a state of the upright posture. This inner jig 404 is composed of a disc-shaped attachment seat 420, a ring 421, and a rotary seat 422. The attachment seat 420 is placed on the two claws 506 constituting the slide arm 505. The ring 421 is engaged with a recessed groove 423 formed on the upper surface of the attachment seat 420, and is fastened thereto by a bolt. The rotary seat 422 is rotatably provided on the ring 421 in a non-contact state with the attachment seat 420. A guide ring 424 is provided on the outer periphery of the upper surface of the rotary seat 422, and the inner tube 204 is placed on the guide ring 424. Also, in addition to the pin holes 507 provided in the two claws 506, positioning holes 425 are bored in the attachment seat 420 so as to engage with set pins 508.

An engagement part 426 is protruded in a center of the rotary seat 422. An alignment hole 427 is bored in the center part of the engagement part 426 concentrically with the engagement part 426. An inside lower angle part, being the alignment hole 427 side of the engagement part 426 is chamfered. Set pins 511 to be engaged with the pin holes 291 provided in the flange 281 of the inner tube 204 are protruded at positions obtained by equally dividing the circumference of an annular part 428 surrounding the engagement part 426 of the rotary seat 422 into three parts.

A set lever 429 is fixed to the outer periphery of the rotary seat 422. This set lever 429 has an extension part formed by further being bent downward on a horizontal part formed in a fixation part. In addition, two positioning pins 430 are protruded outward in a diameter direction at a prescribed angle apart each other, on the outer periphery of the attachment seat 420. The rotary seat 422 is placed on the attachment seat 420, so that the set lever 429 thus extended is disposed between these two poisoning pins 430. The set lever 429 is pressed against one of the positioning pins 430 at an insertion position of the inner tube 204, and the set lever 429 is pressed against the other positioning pin 430 at an attachment position of the inner tube 204.

The assembly of the inner tube 204 is performed after the assembly of the outer tube 205. The inner tube 204 is placed on the rotary seat 422, and at the inner tube insertion position, the positioning piece 292 is aligned with the notch part 298, and the inner tube 204 is inserted from the lower side of the inlet manifold 209 of the reaction vessel body 208. The rotary seat 422 is rotated by using the set lever 429, when the positioning piece 292 of the inner tube 204 passes through the notch part 298 of the inlet manifold 209, and at the inner tube attachment position, the positions of the positioning piece 292 and the notch part 298 are deviated from each other, and the positioning piece 292 is placed on the inner flange 286. The inner tube 204 is vertically placed on the inner flange 286 through the poisoning piece 292. At this time, the inner tube 204 is locked so as not to be deviated from the inner flange 286, by positioning the lock pin 296 provided in the inner flange 286 in the inside of the inner tube 204.

Figure 11:
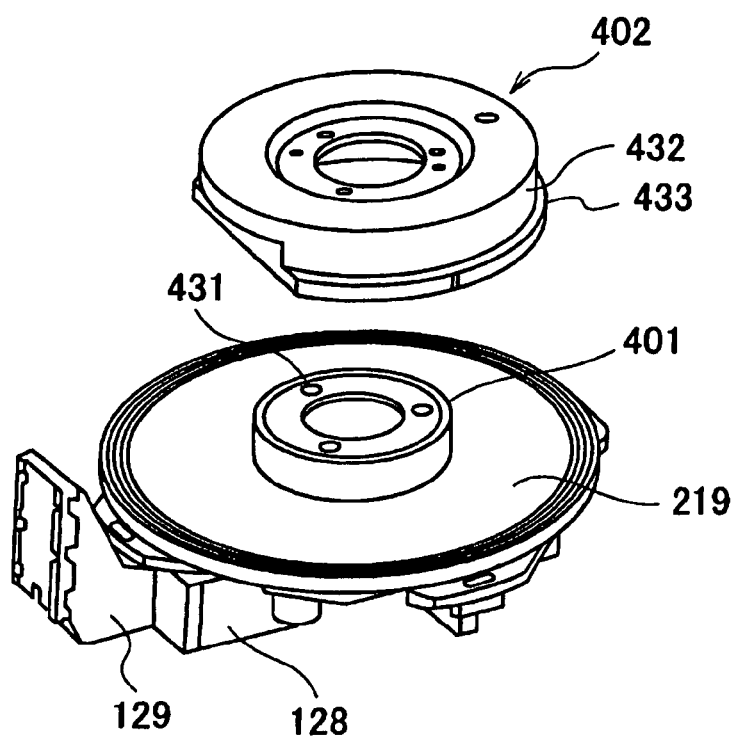
FIG. 11 is an explanatory view of a common jig and an adaptor for a common jig according to an embodiment of the present invention.
Figure 11:
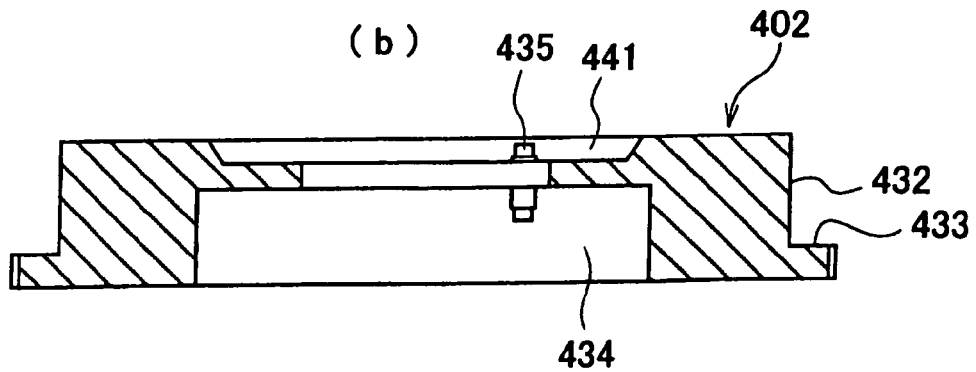

FIG. 11 is an explanatory view of the common jig 402 of an embodiment, FIG. 11A is a perspective view showing a relation between the common jig 402 and the seal cap 219, FIG. 11B is a sectional view of the common jig 402.

The seal cap 219 is provided in the arm 128 on the line extended from the axial center of the inlet manifold 209. The arm 128 is fixed to an elevating block 129, and is extended in a horizontal direction. The elevating block 129 capable of elevating/descending is provided in the boat elevator 115 formed in the lower part of the vertical processing furnace 202.

When the attachment/detachment of the inner tube 204 and the outer tube 205 is performed, attachment/detachment is performed, with the boat 217 detached from the boat elevator 115. The adaptor 401 for the common jig is provided in the seal cap 219. A positioning hole 431 is provided on the upper surface of the adaptor 401 for the common jig.

The common jig 402 is the attachment/detachment jig on which the outer jig 403 or the inner jig 404 can be placed so as to be replaceable, and is engaged with the adaptor 401 for the common jig provided on the seal cap 219. This common jig 402 is formed in a hat shape, and has a cylindrical part 432 with a top and a flange 433. A space 434, in which the adaptor 401 for the common jig is engaged, is formed in the cylindrical part 432. In addition, the tapered recess 441 that engages with the tapered projection 414 provided in the central part of the lower surface of the outer jig 403 is formed in the top of the cylindrical part 432. A positioning pin 435 is protruded in the tapered recess 441, so that the positioning hole 431 of the adaptor 401 for the common jig can be engaged with this positioning pin 435. The positioning pin 435 of this tapered recess 441 is engaged with the positioning hole 431, to thereby determine a positional relation of the common jig 402 relative to the boat elevator 115.

An assembly procedure of the reaction vessel body 208 and the inner tube 204 will be explained hereunder.

(Assembly of the Reaction Vessel Body)

Figure 12:
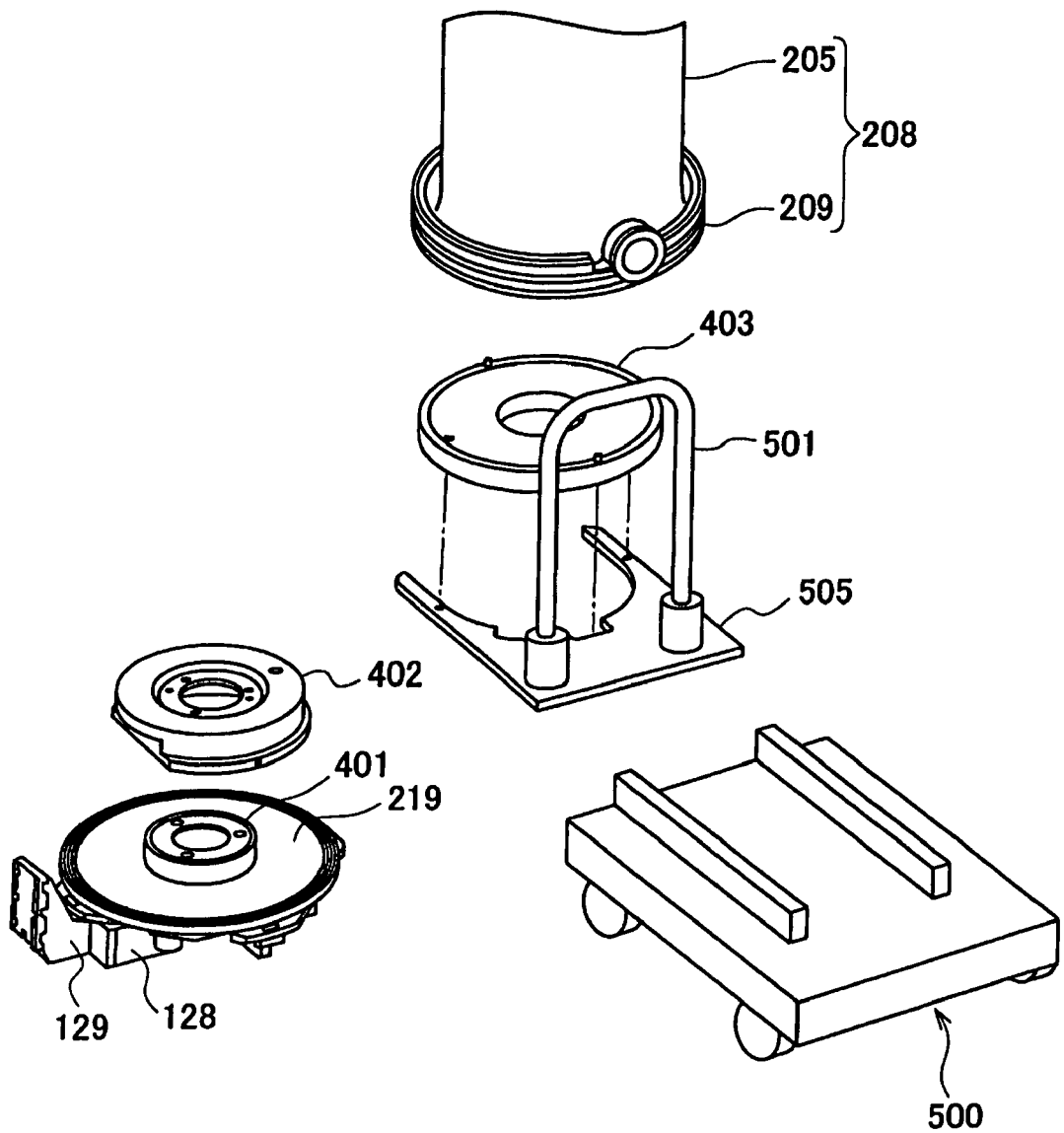
FIG. 12 is an exploded perspective view showing a correlation of each component before the reaction vessel body is assembled according to an embodiment of the present invention.
Figure 13:
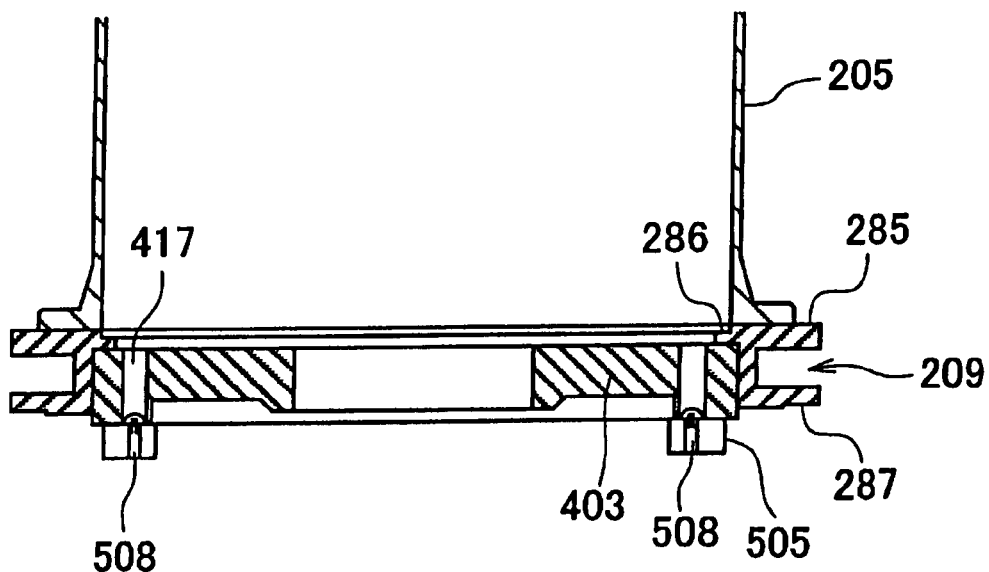
FIG. 13 is a sectional view of a state that the outer jig is engaged with the inlet manifold according to an embodiment of the present invention.
Figure 14:
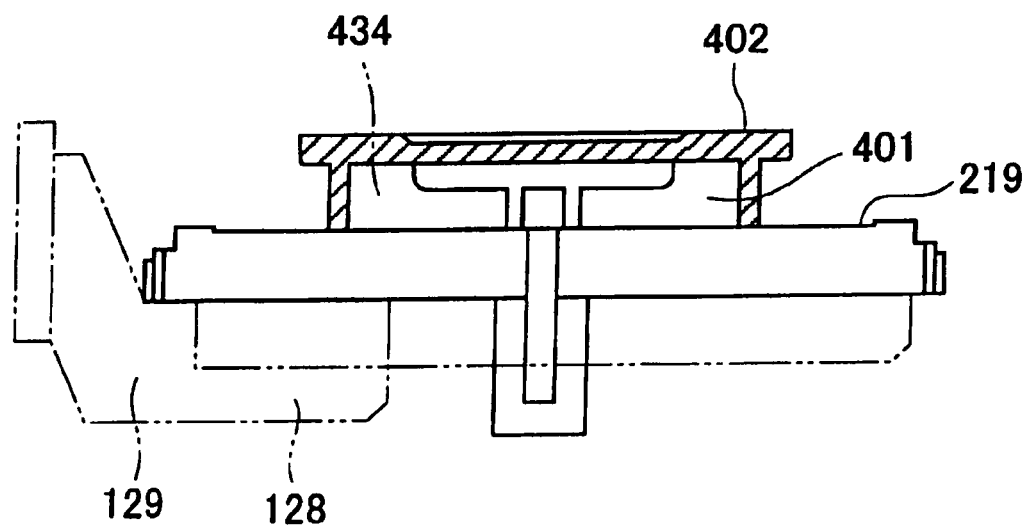
FIG. 14 is a sectional view of a state that the common jig is engaged with the adaptor for the common jig on a seal cap according to an embodiment of the present invention.
Figure 15:
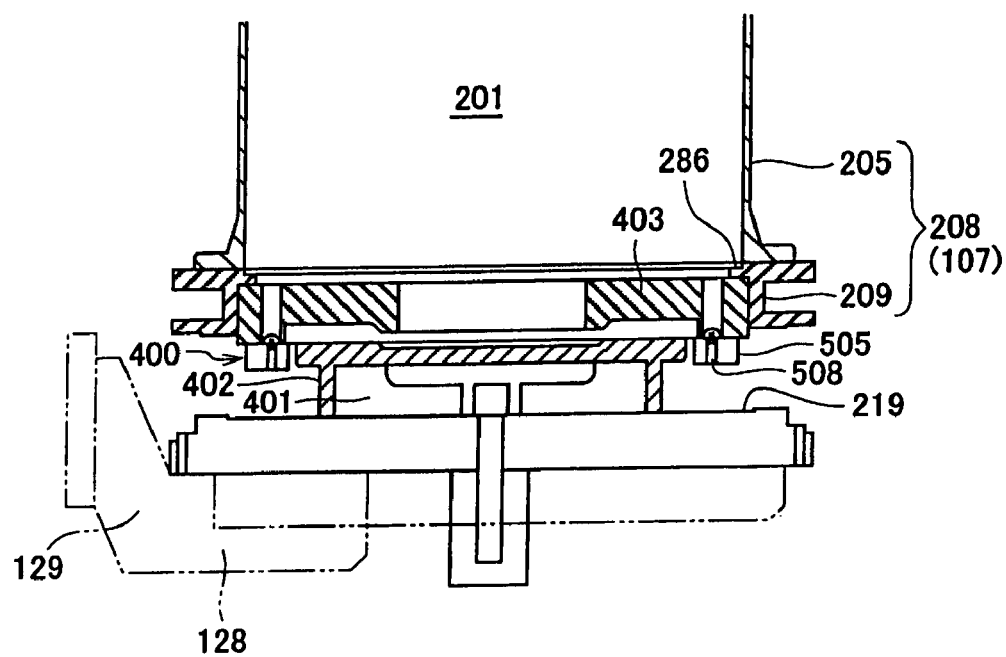
FIG. 15 is a sectional view of a state that the seal cap is elevated to approach the outer jig according to an embodiment of the present invention.
Figure 16:
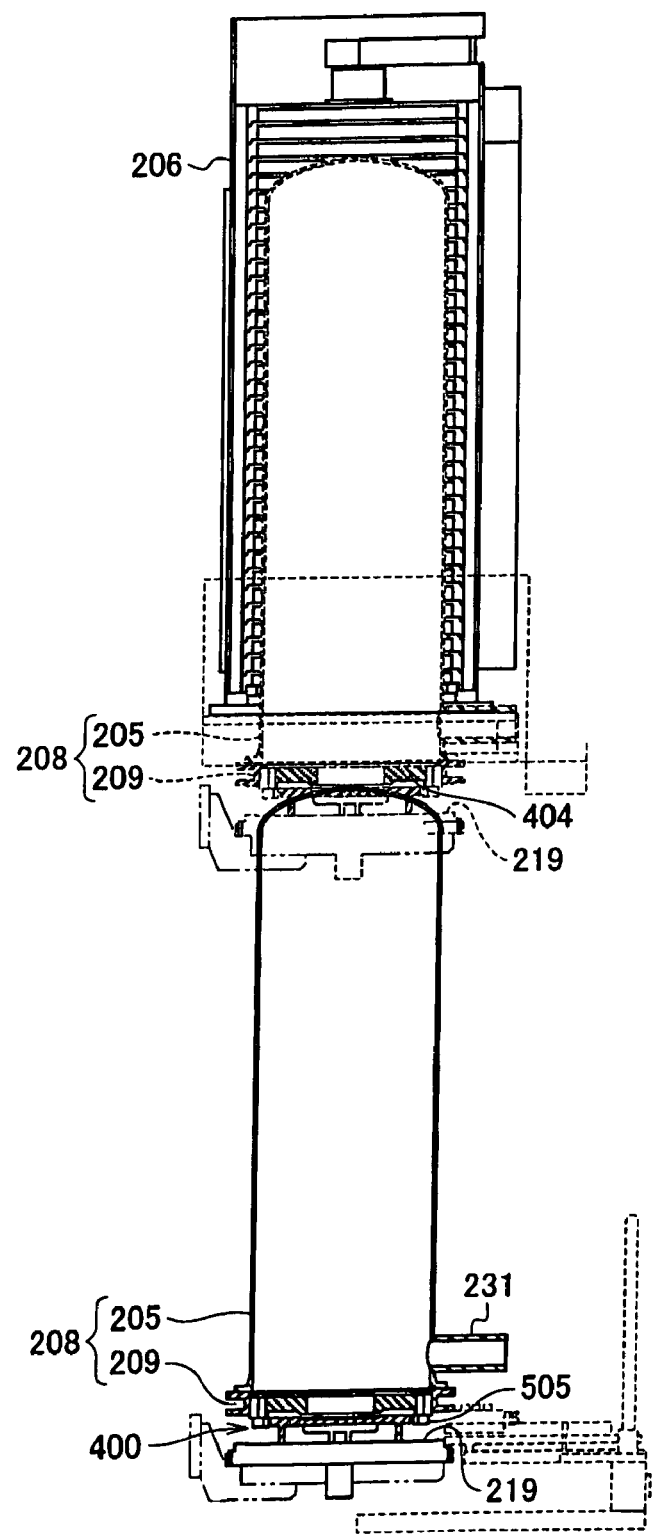
FIG. 16 is a front view showing two states such as a state that the reaction vessel body is transferred onto the seal cap, and a state that the seal cap is descended after the reaction vessel body is mounted on a heater unit, according to an embodiment of the present invention.

First, attachment (assembly) of the outer tube 205 is explained by using FIG. 12, FIG. 13, FIG. 14, FIG. 15, and FIG. 16. FIG. 12 is a decomposed perspective view showing a relation among each member before assembling the reaction vessel body 208, FIG. 13 is a sectional view of a state that the outer jig 403 is engaged with the inlet manifold 209, FIG. 14 is a sectional view of a state that the common jig 402 is engaged with the adaptor 401 for the common jig on the seal cap 219, FIG. 15 is a sectional view of a state that the seal cap 219 is lifted to approach the outer jig 403, and FIG. 16 is a front view showing two states in an overlapping manner, such as a state that the reaction vessel body 208 is placed on the seal cap 219 and a state that the seal cap 210 is descended after the reaction vessel body 208 is attached to the heater unit 206.

As shown in FIG. 4, the door 279 of the maintenance opening part 278 of the casing 111 provided on the maintenance side is opened, and the seal cap 219 in the transfer chamber 124 is set in a state of being descended. In addition, the slide arm 505 is set in a state of being set on the carriage 500 that stands-by in the maintenance area 210 outside the casing 111. As shown in FIG. 12, the outer jig 403 is placed on the side arm 505, and the outer jig 403 is engaged with the inlet manifold 209, to thereby install the outer tube 205 (reaction vessel body 208) upright. The adaptor 401 for the common jig is attached onto the seal cap 219, and the common jig 402 is engaged with this adaptor 401 for the common jig.

As shown in FIG. 13, the engagement of the inlet manifold 209 and the outer jig 403 is performed in such a manner that the upper surface of the outer jig 403 abuts on the lower surface of the inner flange 296 of the inlet manifold 209. In addition, as shown in FIG. 14, the engagement of the common jig 402 and the adaptor 401 for the common jig 402 is performed in such a manner that the adaptor 401 for the common jig is engaged with the common jig 402, and the positioning hole 431 of the adaptor 401 for the common jig is engaged with the positioning pin 435 protruded in the recess 441.

Then, as shown in FIG. 12, after these engagements, the slide arm 505 is advanced by holding the handle 501, and the reaction vessel body 208 is progressed into a furnace lower part in the transfer chamber 124 from the maintenance opening part 278 of the casing 111. The center of the reaction vessel body 208 is aligned with the axial center of the heater unit 206. At this time, as shown in FIG. 15, the common jig 402 placed on the seal cap 219 hides just under the outer jig 403 supported by the slide arm 505.

As shown in FIG. 16, the common jig 402 is elevated through the seal cap 219 to abut on the outer jig 403, and is further elevated, thus lifting the reaction vessel body 208 by the seal cap 219. Thus, the reaction vessel body 208 is transferred onto the common jig 402 on the seal cap 219 from the slide arm 505. The set pin 508 is engaged with the through hole 417 and a positional relation of the attachment/detachment jig 400 relative to the boat elevator 115 is determined.

The slide arm 505 is retreated at a position where the outer jig 403 is elevated until the outer jig 403 is separated from the slide arm 505. Further, the seal cap 219 is elevated up to a position shown by one dot chain line, and the outer tube 205 is inserted into the heater unit 206. Then, the bolt 252 is screwed into the bolt insertion hole 277 of the attachment piece 288 for fixing provided in the inlet manifold 209, and the inlet manifold 209 is fixed to the heater base 251.

In FIG. 16 again, the seal cap 219, with the outer jig 403 placed on the common jig 402, is descended down to a stand-by position. The outer jig 403 is detached from the common jig 402.

(Assembly of the Inner Tube 204)

Next, the assembly of the inner tube 204 will be explained by using FIG. 17, FIG. 18, and FIG. 19.

Figure 17:
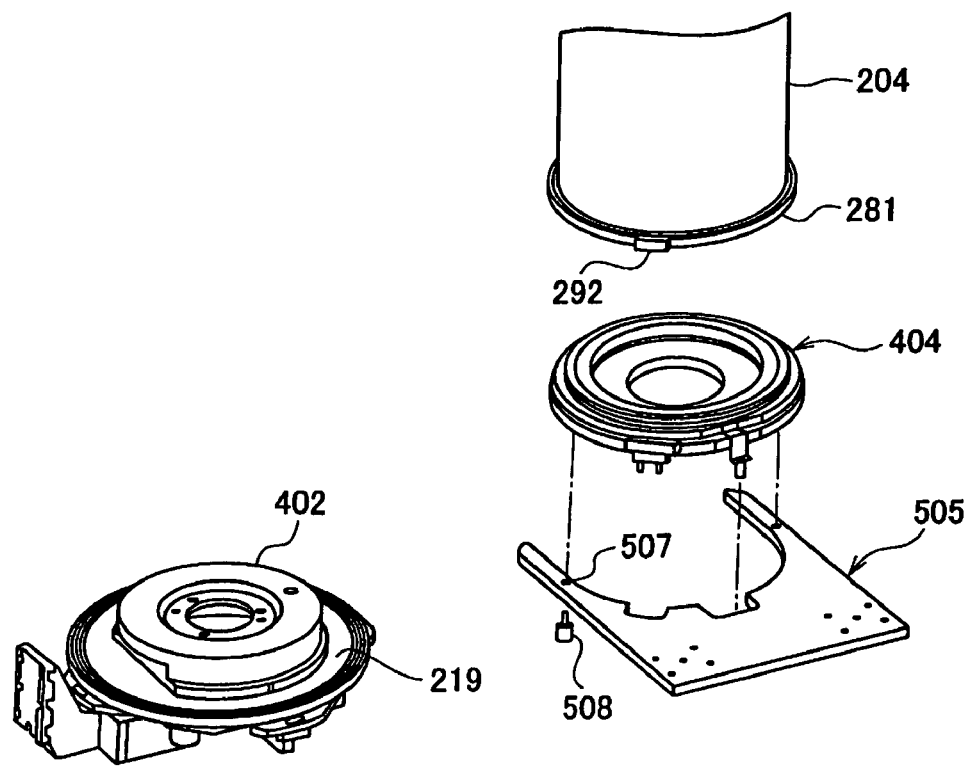
FIG. 17 is an explanatory view of an assembly of the inner tube according to an embodiment of the present invention.
Figure 18:
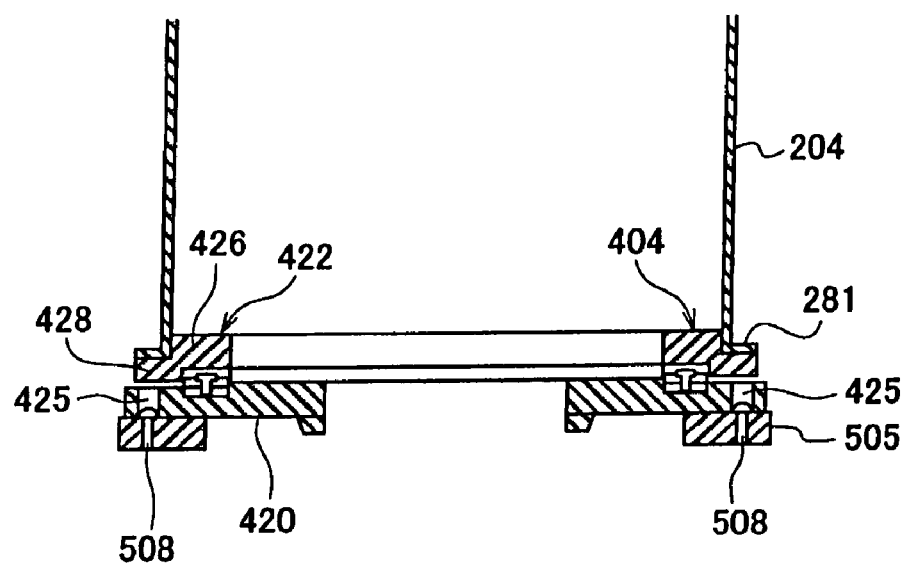
FIG. 18 is an explanatory view of an engagement state of the inner tube and the inner jig according to an embodiment of the present invention.
Figure 19:
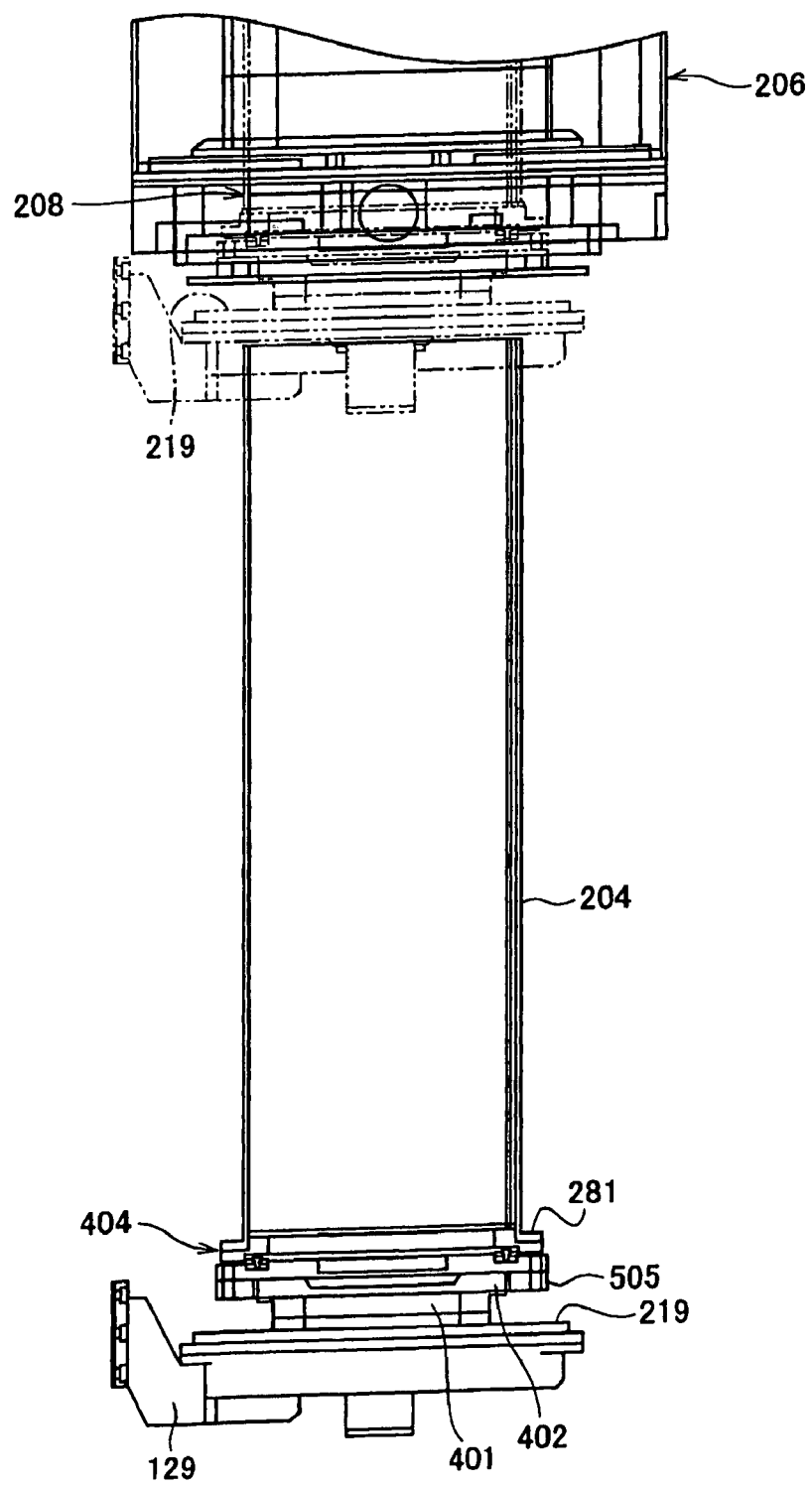
FIG. 19 is a front view showing two states such as a state that the inner tube is transferred onto the seal cap, and a state that the inner tube is inserted into the reaction vessel body, according to an embodiment of the present invention.
Figure 20:
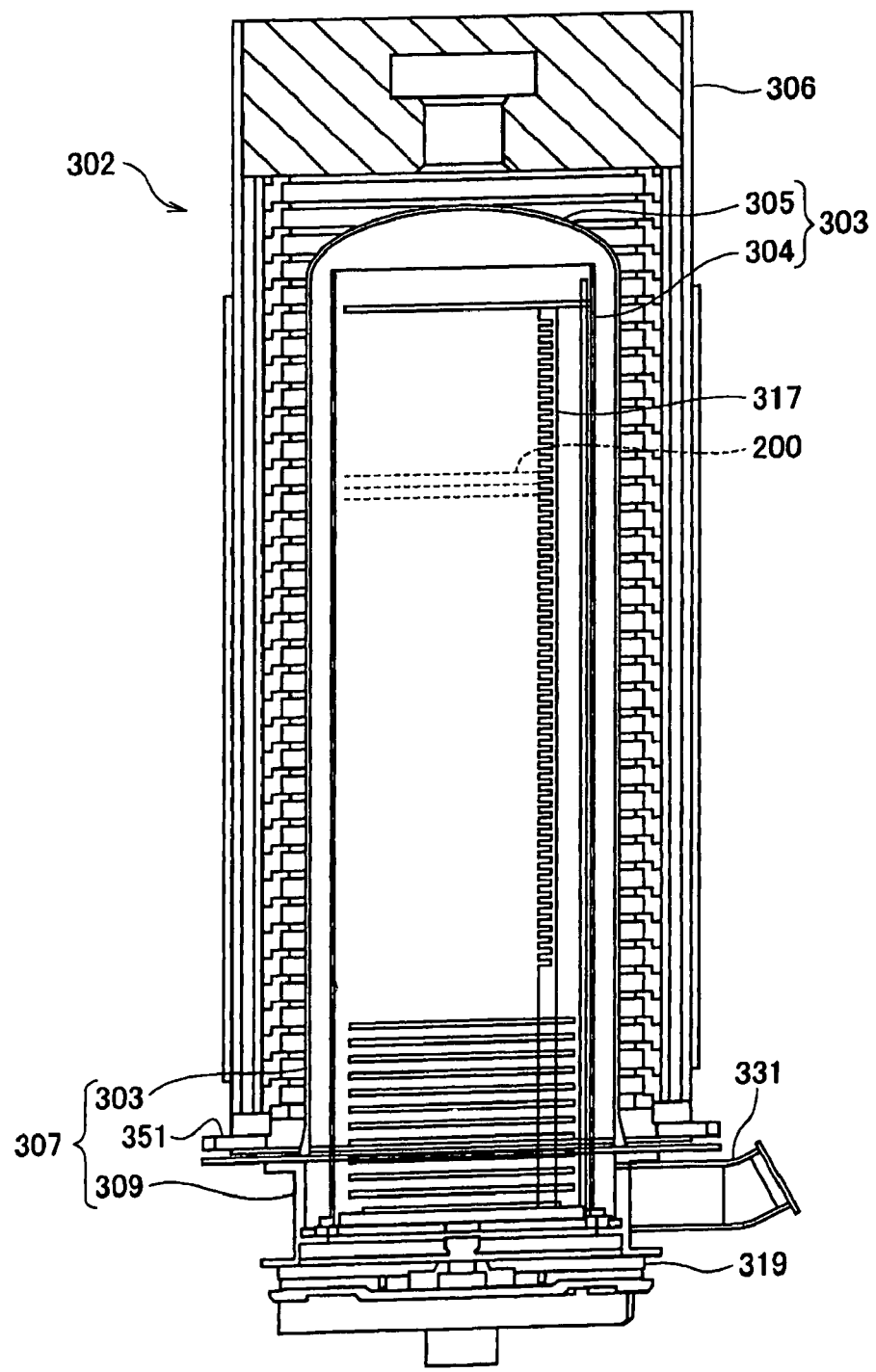
FIG. 20 is an outlined vertical sectional view showing a structure of the processing furnace of the substrate processing apparatus according to a conventional example.
Figure 21:
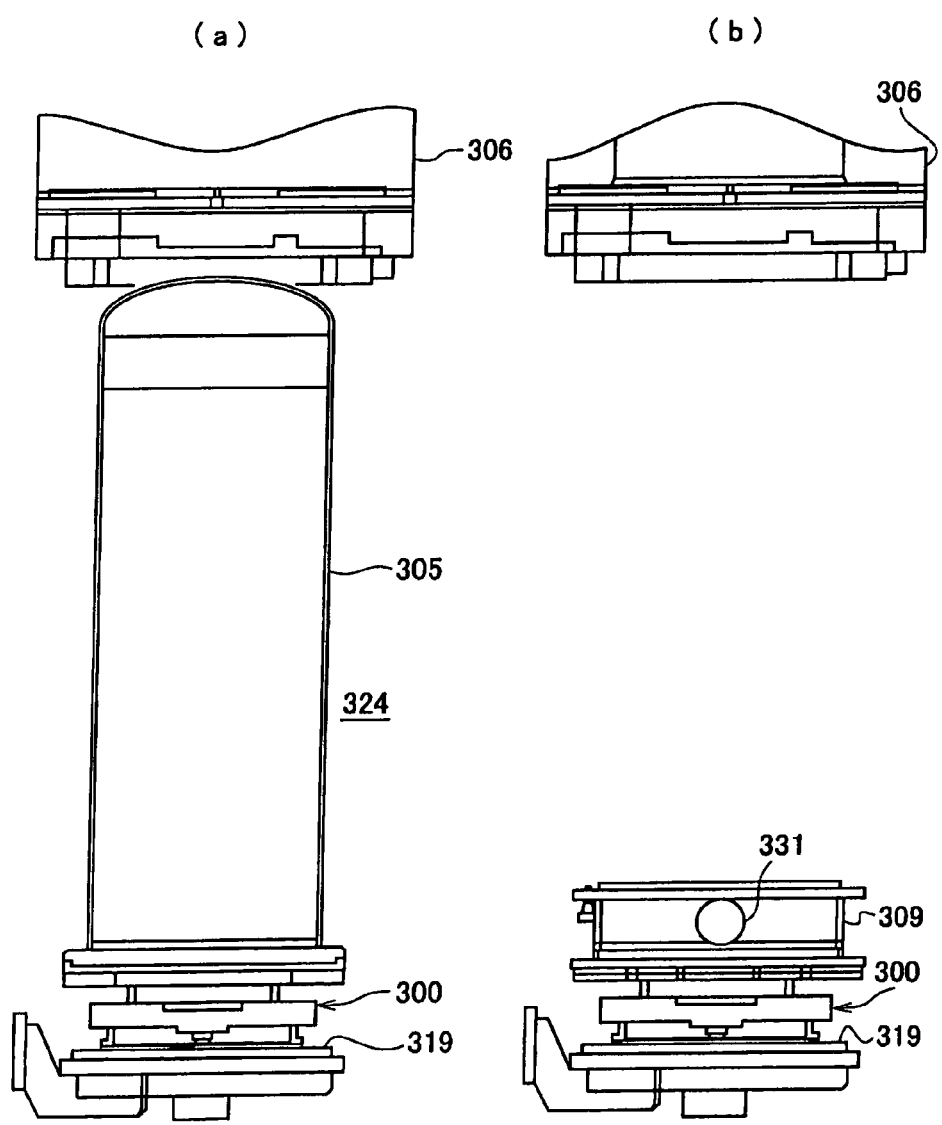
FIG. 21 is an explanatory view of dividing and assembling the outer tube and a furnace throat flange according to a conventional example.

FIG. 17 is an explanatory view of the assembly of the inner tube 204, FIG. 18 is an explanatory view of an engagement state of the inner tube 204 and the inner jig 404, and FIG. 19 is a front view showing two states in an overlapping manner, such as a state that the inner tube 204 is transferred on the seal cap 219, and a state that the inner tube 204 is inserted into the reaction vessel body 208.

First, as shown in FIG. 17, the inner jig 404 is engaged on the slide arm 505 at the stand-by position, and the set pin protruded in the upper side through the pin hole 507 of the slide arm 505 is engaged with the positioning hole 425 of the inner jig 404.

As shown in FIG. 18, the inner tube 204 is installed upright in the inner jig 404. This installment is performed in such a manner that the inner tube 204 is engaged with the engagement part 426 of the rotary seat 422 of the inner jig 404, and the set pin 511 (see FIG. 10D) protruded in the annular part 428 surrounding the engagement part 426 is fitted into the pin hole 291 (see FIG. 8) provided in the flange 281 of the inner tube 204. The attachment seat 420 of the inner jig 404 is supported by the slide arm 505, and the set pin 508 is fitted into the hole 425 to position the inner tube 204 on the inner jig 404.

The slide arm 505 is advanced, and the inner tube 204 is made to proceed into the furnace lower part in the transfer chamber 124 from the maintenance opening part 278 of the casing 111. The center of the engagement part 426 of the inner jig 404 is aligned with the axial center of the heater unit 206.

As shown in FIG. 19, the inner jig 404 is elevated through the elevating block 129 and the seal cap 219, and the inner jig 404 is transferred on the seal cap 219 from the slide arm 505.

The slide arm 505 is retreated at a position where the inner jig 404 is separated from the slide arm 505. Further, the seal cap 219 is elevated up to a height shown by two dot chain line, and the inner tube 204 is inserted into the heater unit 206. The positioning piece 292 of the flange 281 of the inner tube 204 passes through the notch part 298 of the inner flange 286, and the seal cap 219 is elevated until the rotary seat 422 reaches an upper position from the inner flange 286. The rotary seat 422 is rotated by the set lever 429, and the positioning piece 292 is located at a position deviated from the notch part 298.

As shown by two dot chain line of FIG. 19, the seal cap 219 is descended. The positioning piece 292 is placed on the inner flange 286 of the upper end of the inlet manifold 209. The seal cap 219 is descended. The inner jig 404 is detached from the seal cap 219. The attachment of the inner tube 204 is completed by closing the door 279 of the maintenance opening part 278. Thus, the assembly of the reaction vessel body 208 and the inner tube 204 is completed.

Note that the detachment of the inner tube 204 and the reaction vessel body 208 is performed by executing an opposite procedure to the aforementioned attachment work.

Note that according to another aspect of the present invention, needless to say, it can be applied not only to a vertical reaction furnace with inner tube and outer tube structures but also to a vertical reaction furnace with circulating tube and reaction tube structures.

In addition, by using terms such as attaching/detaching jig and attaching/detaching device, explanation has been given to both cases such as when being applied to a case of installing the reaction vessel in the heating device, and when being applied to a case of detaching the reaction vessel from the inside of the heating device, however the present invention is not limited thereto. The present invention may be either case of when being applied only for installing the reaction vessel in the heating device and when applied only for detaching the reaction vessel from the heating device.

As described above, according to this embodiment, when the outer tube 205 and the inlet manifold 209 are attached/detached from the inside of the heater unit 206, the attachment/detachment jig 400 is installed on the seal cap 219, with the outer tube 205 and the inlet manifold 209 not supported at the lower end of the inlet manifold 209 but supported by the inner flange 286 provided on an inner wall of the inlet manifold 209.

Therefore, according to this embodiment, when the outer tube 205 and the inlet manifold 209 are attached/detached from the inside of the heater unit 206, by providing the attachment/detachment jig 400 to support the inner flange 286, the maintenance of the outer tube 205 and the inlet manifold 209 can be easily performed, without changing a device height and without changing a size of the outer tube 205.

Figure 22:
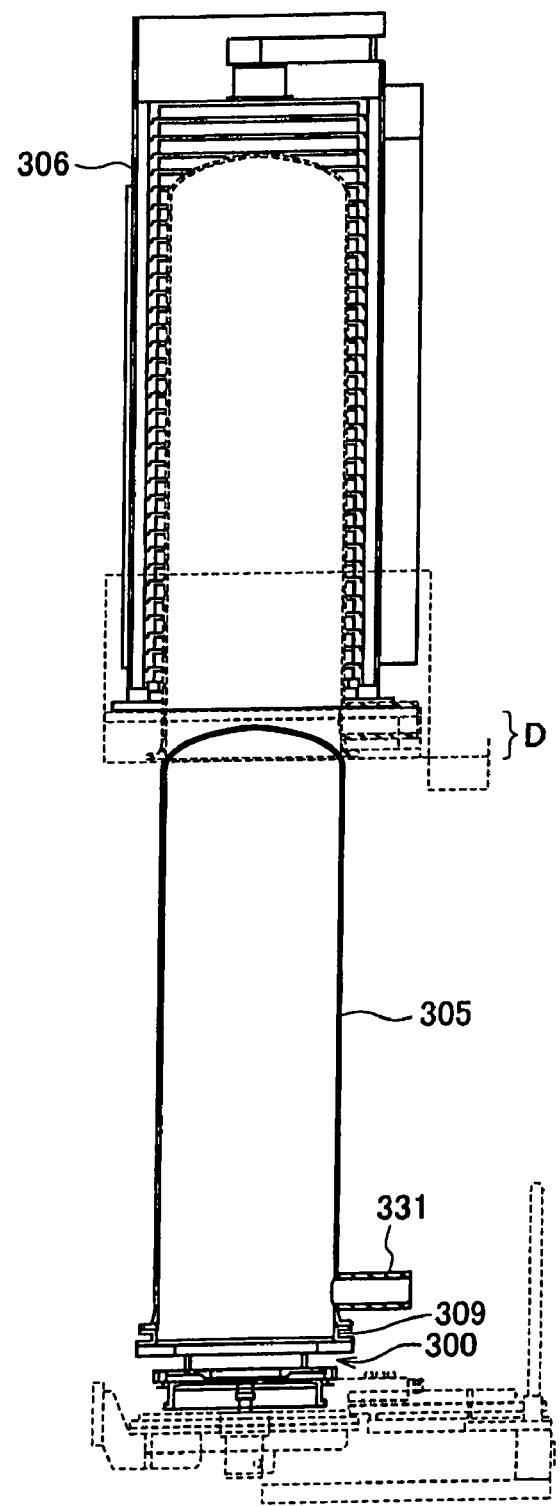
FIG. 22 is an explanatory view showing a problem of a case of assembling the outer tube and the furnace throat flange together according to a conventional example.

Comparative explanation therefore is given by using FIG. 22 showing a conventional supporting method and FIG. 15 showing the supporting method of the embodiment of FIG. 22.

As a method of supporting the outer tube 205 and the inlet manifold 209, as is shown in this embodiment, they are not supported by the inner flange 286 of the inlet manifold 209 but supported at the lower end of the inlet manifold 209 to elevate the seal cap. However, the following problem is involved therein.

For example, as shown in FIG. 22, when the conventional attachment/detachment jig 300 for supporting the lower end of the furnace throat flange 309 to attach/detach the outer tube 305 and the furnace throat flange 309 together, any one of or two or more of the following countermeasures (1) to (3) need to be taken for horizontally moving the outer tube 305 added with height of the attachment/detachment jig from just under the processing furnace and pulling it out from the maintenance opening part that exists in the backside of the casing.

(1) A vertical length of the heater unit 306 is shortened, namely, the vertical length of a soaking area is shortened.

(2) A vertical height of an entire body of a vertical apparatus is increased.

(3) A vertical length of the outer tube 305 is shortened so that the upper end of the outer tube 305 is not lower than the upper end of the maintenance opening part.

However, when the soaking area of the heater unit 306 and the vertical length of the outer tube 305 are shortened, the number of wafers processed at once is reduced, thus deteriorating the throughput. In addition, when the vertical height of the entire body of the vertical apparatus is increased, the height is more increased than the height of a clean room in which the vertical apparatus is installed, thus generating a possibility that the vertical apparatus can not be installed in the clean room. Further, a connection part of an exhaust pipe exists just above the upper end of the maintenance opening part. Therefore, the upper end of the maintenance opening part can not be easily set in further upper side, and further it becomes necessary to detach an exhaust duct that exists outside the casing and connected to the aforementioned connection part.

In this point, according to this embodiment, as shown in FIG. 15, the outer tube 205 and the inlet manifold 209 are made to be supported by the inner flange 286 of the inlet manifold 209. Therefore, a part of the height of the attachment/detachment jig 400 is absorbed in the inlet manifold 209, and total heights of the reaction vessel body 208 and the attachment/detachment jig 400 can be made lower than a conventional example. In addition, since the total heights of the reaction vessel body 208 and the attachment/detachment jig 400 can be made lower, the outer tube 205 and the inlet manifold 209 can be attached/detached without being divided and in a state of being joined together. Further, the lower end of the inlet manifold 209 is opened from the attachment/detachment jig 400, and the attachment piece 288 of the inlet manifold 209 is protruded outward in a diameter direction from the inlet manifold 209. Therefore, it is possible to sufficiently secure a working space for fixing the inlet manifold 209 to the heater base 251. From such a reason, according to this embodiment, the above-described problem of the conventional example can be solved.

In addition, according to other embodiment of the present invention, the exhaust tube 231 is integrally formed not with the inlet manifold 209 made of metal but with the outer tube 205 made of quartz, being non-metal, to thereby form the exhaust tube 231 and a circumference thereof into quartz. With this structure, a metal exposed part in the processing chamber 201 can be reduced, thus realizing the reaction vessel 207 capable of reducing a metal contamination.

Preferred aspects of the present invention will be additionally described hereunder.

A first aspect provides a substrate processing apparatus including:

a reaction vessel having a processing chamber inside that processes a substrate;

a heating device that heats the substrate from an outer peripheral side of the reaction vessel;

a lid member that closes the processing chamber;

an attachment/detachment jig placed on the lid member for attaching/detaching the reaction vessel from the inside of the heating device; and a support section provided in an upper side of a lower end of the reaction vessel on an inside wall of the reaction vessel, and abutted on an upper surface of the attachment/detachment jig for attaching/detaching the reaction vessel from the inside of the heating device.

When the reaction vessel is attached/detached from the inside of the heating device, by providing the support section that abuts on the upper surface of the attachment/detachment jig, a part of the attachment jig enters into the reaction vessel when the reaction vessel is attached/detached from the inside of the heating device. Therefore, maintenance of the reaction vessel can be performed without changing a height of the device and without changing a size of the reaction vessel.

A second aspect provides a substrate processing apparatus according to the first aspect, wherein weight of the reaction vessel is added to the support section when the reaction vessel is abutted on the attachment/detachment jig for attaching/detaching the reaction vessel from the inside of the heating device.

When the reaction vessel is attached/detached from the inside of the heating device, by adding the weight of the reaction vessel to the support section when the support section is abutted on the attachment/detachment jig, there is no necessity of supporting the reaction vessel at a part other than the supporting section. Accordingly, when the reaction vessel is attached/detached from the inside of the heating device, the working space can be increased, thereby facilitating a work. Further, when the substrate is processed in the processing chamber, by tight contact between the lower end of the reaction vessel and the lid member, whereby sealing property (air-tightness) of the processing chamber is obtained, there is no necessity of making the attachment/detachment jig come in contact with the lower end of the reaction vessel. Therefore, the processing chamber can be surely sealed without scratching the lower end of the reaction vessel.

A third aspect provides the substrate processing apparatus according to the first aspect, wherein the attachment/detachment jig is constituted to have a vertical thickness of a part abutted on at least the support section made larger than a vertical length between a lower end of the reaction vessel and a lower end of the support section.

With the structure of the attachment/detachment jig wherein the vertical thickness of the part abutted on at least the support section is made larger than the vertical length between the lower end of the reaction vessel and the lower end of the support section, a part of the attachment/detachment jig protrudes from the lower end of the reaction vessel. Therefore, by supporting the part of the attachment/detachment jig thus protruded from the lower side, the reaction vessel can be supported without touching on the lower end of the reaction vessel.

A fourth aspect provides the substrate processing apparatus according to the first aspect, wherein the reaction vessel is formed in a cylindrical shape, with an upper end closed and a lower end opened, and is formed of a material having heat resistance and corrosion resistance, and an exhaust tube for exhausting an inside of the reaction vessel is integrally formed.

Since the reaction vessel is formed of the material having heat resistance and corrosion resistance, and the exhaust tube is integrally formed, the metal contamination can be reduced.

A fifth aspect provides the substrate processing apparatus according to the first aspect, wherein when the substrate is processed in the reaction vessel, an inner tube having a cylindrical shape with upper and lower ends opened, and formed of a material having heat resistance and corrosion resistance is placed on an upper surface of the support section.

By using the support section for supporting the reaction vessel for attaching/detaching the reaction vessel as a unit for placing the inner tube for processing the substrate, it is not necessary to separately provide the unit for placing the inner tube in the reaction vessel.

A sixth aspect provides the substrate processing apparatus according to the first aspect, wherein the reaction vessel is constituted of a reaction tube and a holder that holds the lower end of the reaction tube.

When the reaction vessel is constituted of the reaction tube and the holder, the reaction tube and the holder can be attached/detached together.

A seventh aspect provides the substrate processing apparatus according to the sixth aspect, wherein the holder has a cylindrical shape, and is concentrically connected with the reaction tube.

When the holder has the cylindrical shape and is concentrically connected with the reaction tube, the holder and the reaction vessel can be attached/detached together.

An eighth aspect provides the substrate processing apparatus according to the sixth aspect, wherein the holder is the substrate processing apparatus formed of metal material. When the holder is formed of the metal material, the strength is increased and a plurality of gas supply lines can be provided.

A ninth aspect provides the substrate processing apparatus according to the sixth aspect, wherein the support section is integrally formed with the holder. When the support section is integrally formed with the holder, the strength of a joint part between the support section and the holder can be increased.

A tenth aspect provides the substrate processing apparatus according to the first aspect, wherein a disc part is formed in the attachment/detachment jig, having an outer diameter smaller than an inner diameter of the reaction vessel and larger than an inner diameter drawn by a tip part of the support section.

When the disc part is formed in the attachment/detachment jig, having the outer diameter smaller than the inner diameter of the reaction vessel and larger than the inner diameter drawn by the tip part of the support section, the reaction vessel can be easily and surely supported by the attachment/detachment jig.

An eleventh aspect provides the substrate processing apparatus according to the tenth aspect, wherein a buffer part that buffers a contact part with the support section on the upper surface of the disc part is formed in the attachment/detachment jig.

When the buffer part that buffers the contact part with the support section on the upper surface of the disc part is formed in the attachment/detachment jig, the reaction vessel can be easily and surely supported without scratching the support section.

A twelfth aspect provides the substrate processing apparatus according to the tenth aspect, wherein the disc part is formed of aluminum alloy. When the disc part is formed of the aluminum alloy, processing of the disc part can be facilitated, and the disc can be lightened. Therefore, workability and safety can be improved.

A thirteenth aspect provides the substrate processing apparatus according to the sixth aspect, wherein the buffer part is formed of a fluorine resin material. When the buffer part is formed of the fluorine resin material, the support section is hardly contaminated.

A fourteenth aspect provides the substrate processing apparatus according to the first aspect, wherein the lower end of the reaction vessel is not added with a weight of the reaction vessel when the reaction vessel is attached/detached from the inside of the heating device.

When the lower end of the reaction vessel is not added with the weight of the reaction vessel when the reaction vessel is attached/detached from the inside of the heating device, the lower end of the reaction vessel can be effectively prevented from being deformed or scratched.

A fifteenth aspect provides the substrate processing apparatus according to the sixth aspect, wherein the lower end of the holder is set in a non-contact state with the attachment/detachment jig when the reaction tube is attached/detached from the inside of the heating device.

When the lower end of the holder is set in the non-contact state with the attachment/detachment jig when the reaction tube is attached/detached from the inside of the heating device, the lower end of the holder can be prevented from being deformed or scratched.

A sixteenth aspect provides the substrate processing apparatus according to the first aspect, wherein a preliminary chamber continuously provided on a lower side of the processing chamber and a maintenance area adjacent to one side surface of the preliminary chamber are provided so as to be communicated with each other, and an opening part is provided so as to open in one side surface to enable the attachment/detachment jig to be moved horizontally, in a state of supporting the reaction vessel by the support section, between the preliminary chamber and the maintenance area.

Even in a case of having the opening part opened in one side surface to enable the attachment/detachment jig to be moved horizontally between the preliminary chamber and the maintenance area, the maintenance of the reaction vessel can be performed without changing the height of the apparatus or without changing the size of the reaction vessel.

A seventeenth aspect provides the substrate processing apparatus according to the tenth aspect, wherein the opening part is opened so that the attachment/detachment jig can not be moved horizontally between the preliminary chamber and the maintenance area, with the reaction vessel supported by the attachment/detachment jig on the lower end of the reaction vessel.

When the opening part is opened so that the attachment/detachment jig can not be moved horizontally between the preliminary chamber and the maintenance area in a state of supporting the reaction vessel by the attachment/detachment jig on the lower end of the reaction vessel, a diameter of the upper end of the opening part is not expanded upward. Therefore, by expanding the diameter of the upper end of the opening part upward, a troublesome work does not occur, such as detaching the exhaust duct connected to the exhaust tube at the time of attaching/detaching the reaction vessel.

An eighteenth aspect provides a semiconductor manufacturing device, including a reaction vessel having inside a processing chamber that processes a substrate; a heating device that heats the substrate from an outer peripheral side of the reaction vessel; a lid member that closes the processing chamber; an attachment/detachment jig placed on the lid member when the reaction vessel is attached/detached from the inside of the heating device; and a support section provided in an upper side of a lower end of the reaction vessel and abuts on an upper surface of the attachment/detachment jig when the reaction vessel is attached/detached from the inside of the heating device.

When the reaction vessel is attached/detached from the inside of the heating device, by providing the support section that abuts on the upper surface of the attachment/detachment jig, the maintenance of the reaction vessel can be performed without changing the height of the apparatus or without changing the size of the reaction vessel by providing the attachment/detachment jig so as to be supported by the support section when the reaction vessel is attached/detached from the inside of the heating device.

A nineteenth aspect provides an attaching/detaching method of the reaction vessel, including the steps of:

heating and processing the substrate by the heating device from the outer peripheral side of the reaction vessel, with the processing chamber having the reaction vessel inside closed by a lid member;

placing the attachment/detachment jig on the lid member; and making support section provided on an upper side of the lower end of the reaction vessel on an inner side wall of the reaction vessel and an upper surface of the attachment/detachment jig abut on each other, and detaching the reaction vessel from the inside of the heating device.

When the reaction vessel is detached from the inside of the heating device, by providing the support section that abuts on the upper surface of the attachment/detachment jig, the maintenance of the reaction vessel can be performed without changing the height of the apparatus or without changing the size of the reaction vessel when the reaction vessel is attached/detached from the inside of the heating device.

What is claimed is:

1. A substrate processing apparatus, comprising:
a reaction vessel having a processing chamber inside that processes a substrate;
a heating device that heats said substrate from an outer peripheral side of the reaction vessel;
a lid member that closes said processing chamber;

an attachment/detachment jig placed on said lid member for attaching/detaching said reaction vessel from an inside of said heating device; and a support section provided above a lower end of the reaction vessel on an inside wall of said reaction vessel, and abutted on an upper surface of said attachment/detachment jig for attaching/detaching said reaction vessel from the inside of said heating device.

2. The substrate processing apparatus according to claim 1, wherein weight of said reaction vessel is added to said support section when said reaction vessel is abutted on said attachment/detachment jig for attaching/detaching said reaction vessel from the inside of said heating device.

3. The substrate processing apparatus according to claim 1, wherein said attachment/detachment jig is constituted to have a vertical thickness of a part abutted on at least said support section made larger than a vertical length between a lower end of said reaction vessel and a lower end of said support section.

4. The substrate processing apparatus according to claim 1, wherein when said substrates is processed in said reaction vessel, an inner tube is placed on an upper surface of said support section, the inner tube having a cylindrical shape with upper and lower ends opened and formed of a material having heat resistance and corrosion resistance.

5. The substrate processing apparatus according to claim 1, wherein said reaction vessel is constituted of a reaction tube and a holder that holds a lower end of this reaction tube, and the support section is provided in the holder.

6. The substrate processing apparatus according to claim 5, wherein the lower end of said holder is set in a non-contact state with said attachment/detachment jig when said reaction tube is attached/detached from the inside of said heating device.

7. The substrate processing apparatus according to claim 1, wherein a disc part is formed in said attachment/detachment jig, the disc part abutting the support section, having an outer diameter smaller than an inner diameter of said reaction vessel and larger than an inner diameter of said support section.

8. The substrate processing apparatus according to claim 7, wherein said disc part is formed of aluminum alloy.

9. The substrate processing apparatus according to claim 1, wherein the lower end of said reaction vessel does not contact the attached/detached jig and does not support a weight of said reaction vessel when said reaction vessel is attached/detached from the inside of said heating device.

10. The substrate processing apparatus according to claim 1, wherein a preliminary chamber continuously provided on a lower side of said processing chamber and a maintenance area adjacent to one side surface of said preliminary chamber are provided so as to be communicated with each other, and an opening part is provided so as to open in one side surface to enable the attachment/detachment jig to be moved horizontally between said preliminary chamber and said maintenance area.

11. The substrate processing apparatus according to claim 10, wherein said opening part is dimensioned so that the attachment/detachment jig can not be moved horizontally between said preliminary chamber and said maintenance area, with said reaction vessel supported by said attachment/detachment jig on the lower end of said reaction vessel.

12. A substrate processing apparatus, comprising:
a reaction vessel having inside a processing chamber that processes a substrate;
a heating device that heats said substrate from an outer peripheral side of this reaction vessel;
a lid member that closes said processing chamber;
an attachment/detachment jig placed on said lid member when said reaction vessel is attached in the inside of said heating device; and
a support section provided above a lower end of said reaction vessel on an inside wall of said reaction vessel, and abutted on said attachment/detachment jig for attaching said reaction vessel in the inside of said heating device.

13. An attaching/detaching method of the reaction vessel using the substrate processing apparatus according to claim 1, comprising the steps of:
placing said attachment/detachment jig on said lid member; and
making said support section and said attachment/detachment jig abut on each other and attaching said reaction vessel in the inside of said heating device.

14. An attaching/detaching method of the reaction vessel using the substrate processing apparatus according to claim 12, comprising the steps of:
placing said attachment/detachment jig on said lid member; and
making said support section and said attachment/detachment jig abut on each other and attaching said reaction vessel in the inside of said heating device.

15. A manufacturing method of a semiconductor device that processes a substrate by using the substrate processing device according to claim 1, comprising the steps of:
making said support section and said attachment/detachment jig abut on each other and attaching said reaction vessel in the inside of said heating device;
detaching said attachment/detachment jig from said lid member; and
closing the processing chamber provided inside of said attached reaction vessel with a lid member and heating and processing the substrate from the outer peripheral side of said reaction vessel.

16. A manufacturing method of a semiconductor device that processes the substrate by using the substrate processing apparatus according to claim 12, comprising the steps of:
making said support section and said attachment/detachment jig abut on each other and attaching said reaction vessel in the inside of said heating device;
detaching said attachment/detachment jig form said lid member; and
closing the processing chamber provided in the inside of said attached reaction vessel by the lid member and heating and processing the substrate by the heating device from the outer peripheral side of said reaction vessel.

17. A manufacturing method of a semiconductor device, comprising the steps of:
making a support section provided above a lower end of a reaction vessel on an inner wall of said reaction vessel and an attachment/detachment jig placed on a lid member that closes said reaction vessel abut on each other and attaching said reaction vessel in the inside of a heating device;
detaching said attachment/detachment jig from said lid member; and
closing a processing chamber provided in the inside of said attached reaction vessel by said lid member and heating and processing a substrate by said heating device from an outer peripheral side of said reaction vessel.

* * * * *